United States Patent
Ariyoshi et al.

(10) Patent No.: US 8,415,215 B2
(45) Date of Patent: Apr. 9, 2013

(54) METHOD OF MANUFACTURING SEMICONDUCTOR DEVICE WITH MULTIPLE IMPLANTATION STEPS

(75) Inventors: Junichi Ariyoshi, Yokohama (JP); Taiji Ema, Yokohama (JP)

(73) Assignee: Fujitsu Semiconductor Limited, Yokohama-shi (JP)

( * ) Notice: Subject to any disclaimer, the term of this patent is extended or adjusted under 35 U.S.C. 154(b) by 165 days.

(21) Appl. No.: 13/111,280

(22) Filed: May 19, 2011

(65) Prior Publication Data

US 2012/0045875 A1 Feb. 23, 2012

(30) Foreign Application Priority Data

Aug. 20, 2010 (JP) ................ 2010-184518

(51) Int. Cl.
*H01L 21/8238* (2006.01)
*H01L 21/8234* (2006.01)
*H01L 21/8236* (2006.01)
*H01L 21/425* (2006.01)

(52) U.S. Cl.
USPC ............ 438/217; 438/275; 438/276; 438/527

(58) Field of Classification Search ............... None
See application file for complete search history.

(56) References Cited

U.S. PATENT DOCUMENTS

| | | | | |
|---|---|---|---|---|
| 4,651,406 A | * | 3/1987 | Shimizu et al. | 438/275 |
| 4,717,684 A | * | 1/1988 | Katto et al. | 438/200 |
| 6,001,677 A | * | 12/1999 | Shimizu | 438/231 |
| 6,133,082 A | | 10/2000 | Masuoka | |
| 6,429,261 B1 | * | 8/2002 | Lang et al. | 525/191 |
| 6,492,690 B2 | * | 12/2002 | Ueno et al. | 257/392 |
| 6,551,884 B2 | * | 4/2003 | Masuoka | 438/275 |
| 6,759,706 B2 | * | 7/2004 | Kobayashi | 257/314 |
| 6,780,717 B2 | * | 8/2004 | Yasuoka et al. | 438/276 |
| 7,208,359 B2 | * | 4/2007 | Ueda et al. | 438/197 |
| 7,560,772 B2 | * | 7/2009 | Sakai et al. | 257/336 |
| 7,619,288 B2 | * | 11/2009 | Hotta | 257/402 |
| 7,741,677 B2 | * | 6/2010 | Sakai et al. | 257/336 |
| 7,867,858 B2 | * | 1/2011 | Nallapati et al. | 438/275 |
| 2001/0039093 A1 | * | 11/2001 | Oohashi | 438/275 |
| 2005/0227440 A1 | | 10/2005 | Ema et al. | |
| 2007/0298571 A1 | * | 12/2007 | Park et al. | 438/275 |
| 2008/0280406 A1 | | 11/2008 | Ema et al. | |
| 2008/0286928 A1 | * | 11/2008 | Minami | 438/275 |
| 2009/0191700 A1 | * | 7/2009 | Nakagawa | 438/593 |
| 2009/0275181 A1 | * | 11/2009 | Kato et al. | 438/275 |
| 2010/0320543 A1 | | 12/2010 | Ema et al. | |

FOREIGN PATENT DOCUMENTS

| | | |
|---|---|---|
| JP | 02-022862 A | 1/1990 |
| JP | 2000-077541 A | 3/2000 |
| WO | 2004-112139 A1 | 12/2004 |

\* cited by examiner

*Primary Examiner* — Scott B Geyer
(74) *Attorney, Agent, or Firm* — Westerman, Hattori, Daniels & Adrian, LLP

(57) ABSTRACT

A method of manufacturing a semiconductor device includes: forming first to third gate electrodes in first to third regions, respectively; forming a first mask pattern covering the second region while exposing the first and third regions; forming p-type source drain extensions and p-type pocket regions by ion implantation using the first mask pattern as a mask; forming n-type source drain extensions by ion implantation using the first mask pattern as a mask; forming a second mask pattern covering the first and third regions while exposing the second region; and forming p-type pocket regions by implanting ions of indium into the silicon substrate with the second mask pattern being used as a mask.

14 Claims, 20 Drawing Sheets

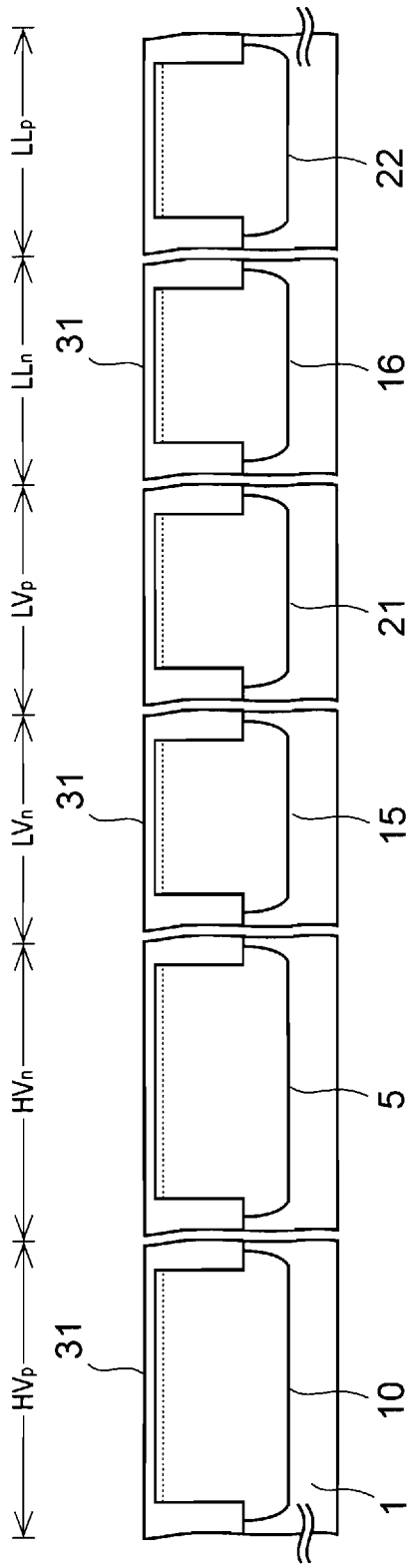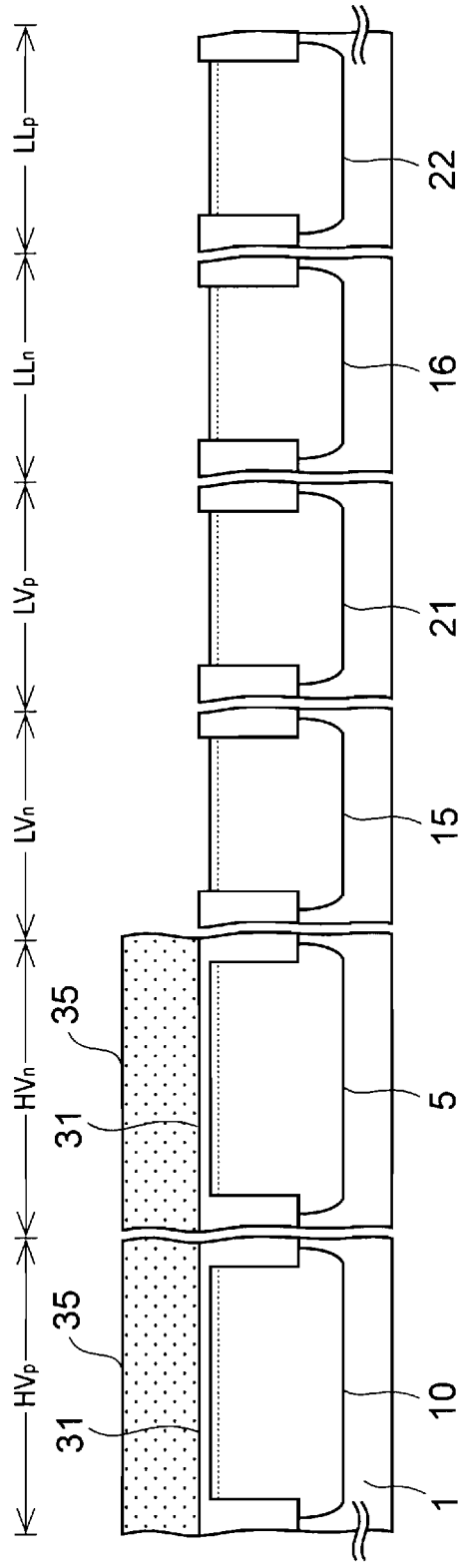

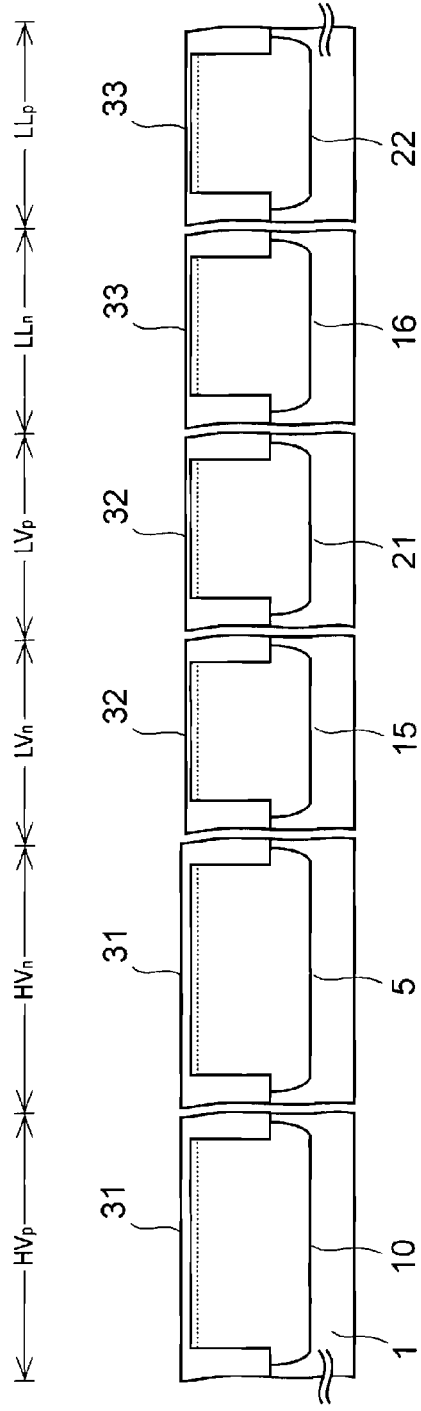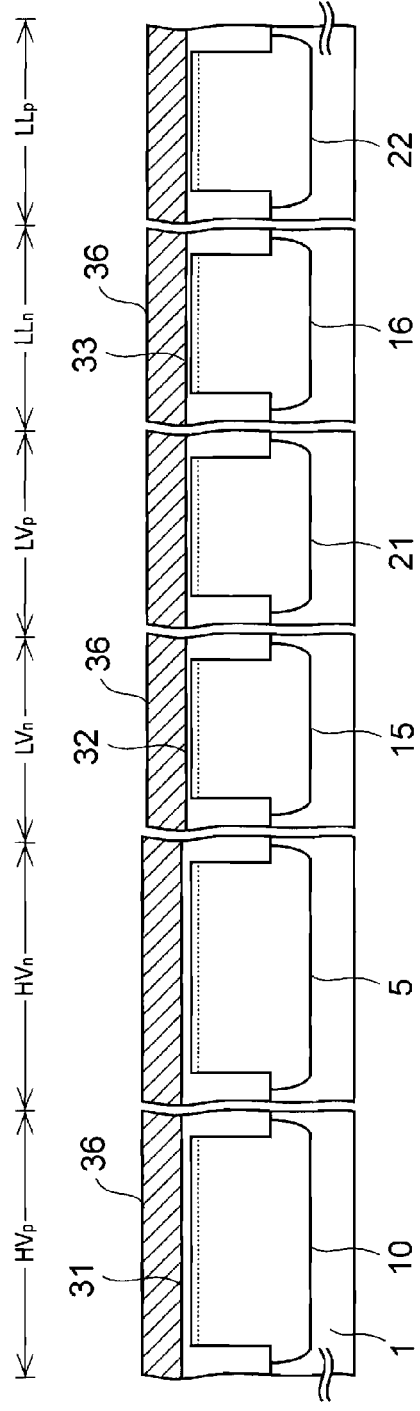
FIG. 1K
FIG. 1L

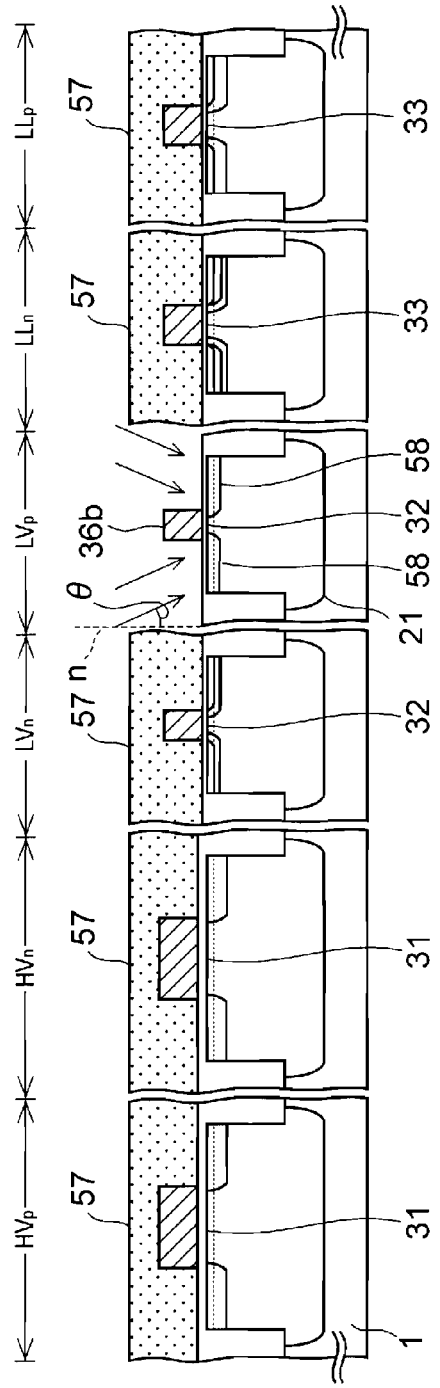
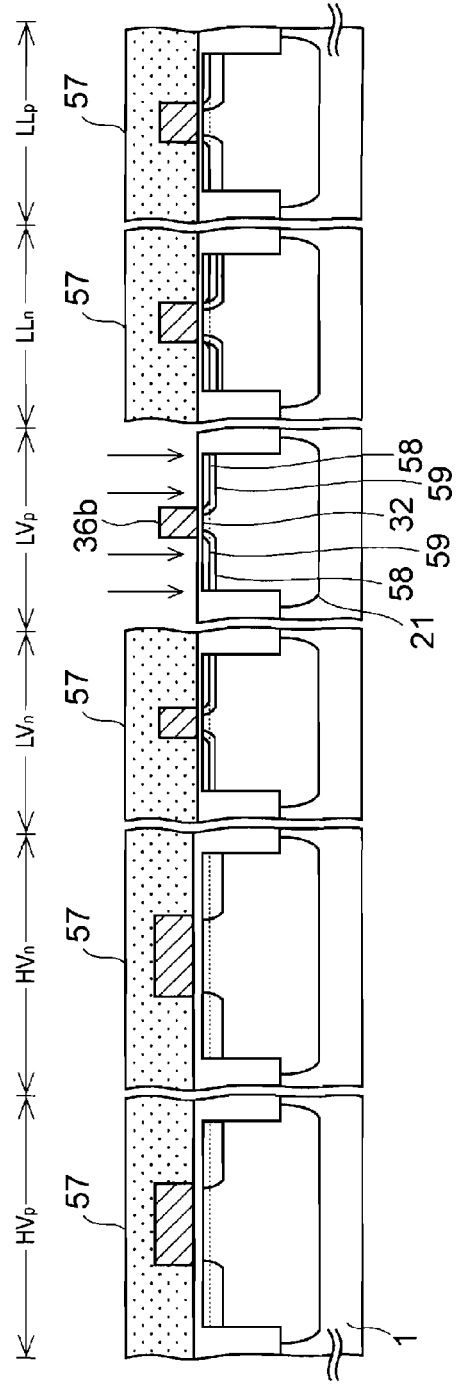
FIG. 1U
FIG. 1V

METHOD OF MANUFACTURING SEMICONDUCTOR DEVICE WITH MULTIPLE IMPLANTATION STEPS

CROSS-REFERENCE TO RELATED APPLICATION

This application is based upon and claims the benefit of priority of the prior Japanese Patent Application No. 2010-184518, filed Aug. 20, 2010, the entire contents of which are incorporated by reference.

FIELD

It is related to a method of manufacturing a semiconductor device.

BACKGROUND

With recent improvements in performances of electronic devices, some semiconductor devices such as LSI in each of which a plurality of types of MOS transistors different in electrical characteristics such as an operation voltage and an operation speed are mixedly mounted on a single semiconductor substrate.

Each MOS transistor includes various impurity regions. Examples of such impurity regions include a channel region, a source drain region, an extension region, a pocket region, and the like.

Among them, the channel region is provided to adjust a threshold voltage of the MOS transistor, and is provided in a portion of the semiconductor substrate between the source drain regions.

Moreover, the extension region is provided to prevent concentration of a high electric field between the source drain region and the channel region. The extension region is formed to be shallower and to have a lower impurity concentration than the source drain regions.

The pocket region is provided to prevent a short channel effect between the source drain regions. The pocket region is formed in a portion of the semiconductor substrate under a gate electrode by implanting an impurity with a conductivity type opposite to that of the source drain regions.

These impurity regions are formed individually by implanting ions of impurities into the semiconductor substrate. However, a product in which a plurality of types of MOS transistors are mixedly mounted as described above needs an increased number of ion implantation steps, which thereby leads to increase in manufacturing cost.

Note that, techniques related to this application are disclosed in International Publication Pamphlet No. WO 2004/112139, Japanese Laid-open Patent Publications Nos. 02-022862 and 2000-77541.

SUMMARY

According to one aspect discussed herein, there is provided a method of manufacturing a semiconductor device including forming a first gate insulating film in a first region of a semiconductor substrate, forming a second gate insulating film in a second region of the semiconductor substrate, the second gate insulating film being thinner than the first gate insulating film, forming a third gate insulating film in a third region of the semiconductor substrate, the third gate insulating film being thinner than the first gate insulating film, forming a first gate electrode, a second gate electrode, and a third gate electrode on the first gate insulating film, the second gate insulating film, and the third gate insulating film, respectively, forming a first mask pattern after forming the first gate electrode, the second gate electrode, and the third gate electrode, the first mask pattern covering the second region while exposing the first region and the third region, forming a first source drain extension in the semiconductor substrate beside the first gate electrode and forming a first pocket region in the semiconductor substrate beside the third gate electrode by implanting ions of a first impurity of a first conductivity type into the semiconductor substrate with the first mask pattern being used as a mask, forming a second source drain extension in the semiconductor substrate beside the third gate electrode by implanting ions of a second impurity of a second conductivity type into the semiconductor substrate with the first mask pattern being used as a mask, under a condition that makes the second impurity under the first gate insulating film have a lower concentration than the first impurity, forming a second mask pattern after removing the first mask pattern, the second mask pattern covering the first region and the third region while exposing the second region, forming a second pocket region in the semiconductor substrate beside the second gate electrode by implanting ions of a third impurity of the first conductivity type into the semiconductor substrate with the second mask pattern being used as a mask, the third impurity having a smaller diffusion coefficient than the first impurity, forming a third source drain extension in the semiconductor substrate beside the second gate electrode by implanting ions of a fourth impurity of the second conductivity type into the semiconductor substrate with the second mask pattern being used as a mask, forming a first source drain region of the first conductivity type in the semiconductor substrate beside the first gate electrode, forming a second source drain region of the second conductivity type in the semiconductor substrate beside the second gate electrode, and forming a third source drain region of the second conductivity type in the semiconductor substrate beside the third gate electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

FIGS. 1A to 1Z and 2A to 2C are cross-sectional views of a semiconductor device in the course of manufacturing thereof according to an embodiment.

In the present embodiment, a plurality of types of MOS transistors are mixedly mounted on a single semiconductor substrate as described below.

Figure 1A:
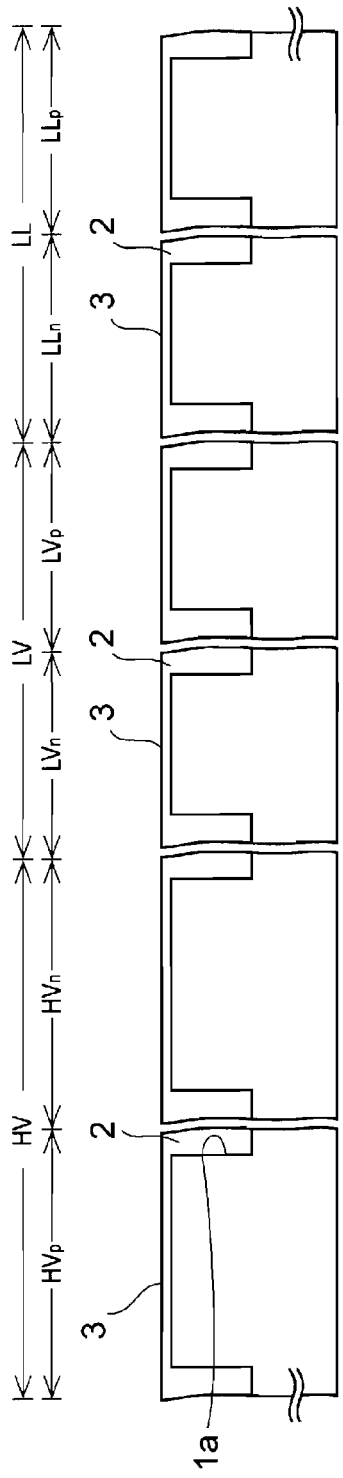
FIGS. 1A to 1Z and 2A to 2C are each a cross-sectional view of a semiconductor device in the course of manufacturing thereof according to an embodiment.

Firstly, as illustrated in FIG. 1A, element isolation grooves 1a are formed in a silicon substrate 1, and a silicon oxide film is formed in the element isolation grooves 1a as an element isolation insulating film 2 by the CVD method. Such an element isolation structure is called shallow trench isolation (STI). Local oxidation of silicon (LOCOS) may be employed instead of STI to isolate elements from each other.

Then, a thermal oxidation film with a thickness of approximately 10 nm is formed as a sacrificial insulating film 3 by subjecting a surface of the silicon substrate 1 to thermal oxidation.

As illustrated in FIG. 1A, the silicon substrate 1 includes a high voltage transistor formation region HV, a low voltage transistor formation region LV, and a low leak transistor formation region LL.

Among them, the high voltage transistor formation region HV is a region in which a high voltage transistor is to be formed, and is divided into a p-type high voltage transistor formation region $HV_p$, and an n-type high voltage transistor formation region $HV_n$.

The low voltage transistor formation region LV is a region in which a transistor driven at a lower voltage than that in the region HV is to be formed. In the low voltage transistor formation region LV, an n-type low voltage transistor formation region $LV_n$ and p-type low voltage transistor formation region $LV_p$ are defined.

The low leak transistor formation region LL is a region in which a transistor driven at a lower voltage than that in the region HV and having a lower leak current than that in the region LV is to be formed. The low leak transistor formation region LL is divided into an n-type low leak transistor formation region $LL_n$ and a p-type low leak transistor formation region $LL_p$.

Note that, as understood from a comparison between the region LV and the region LL, the transistor to be formed in the region LV has a faster operating speed than that in the region LL, which will be described later.

Figure 1B:
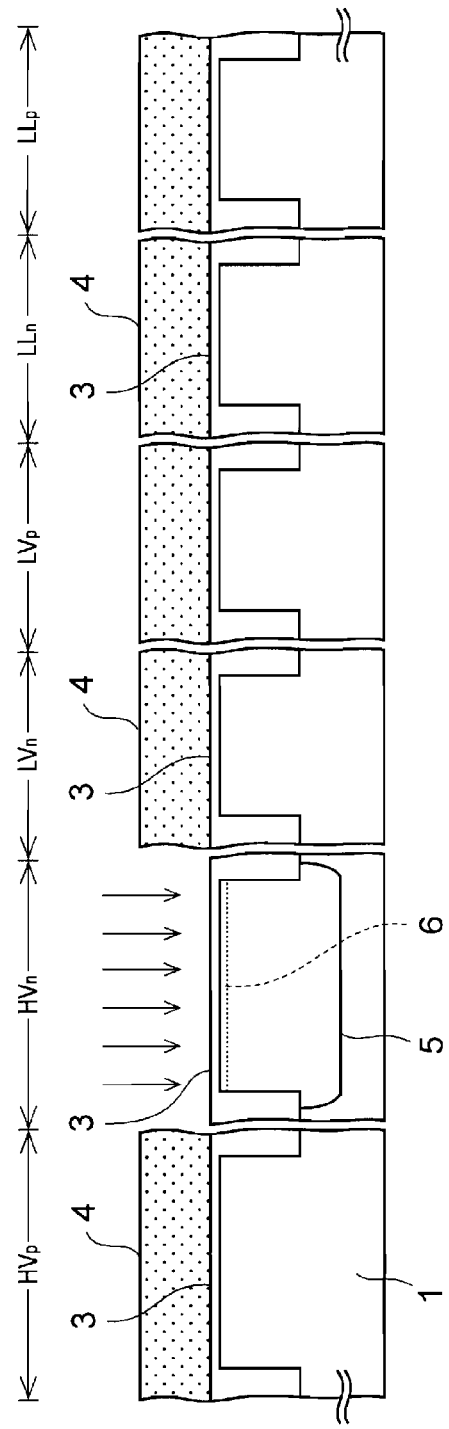

Next, as illustrated in FIG. 1B, photoresist is applied onto the sacrificial insulating film 3. The photoresist is then exposed to light and developed to form a first mask pattern 4.

Subsequently, $B^+$ ions are implanted as a p-type impurity into the n-type high voltage transistor formation region $HV_n$ of the silicon substrate 1, the region $HV_n$ not being covered with the first mask pattern 4. Thus, a first p well 5 is formed.

The first mask pattern 4 is continuously used as a mask, and $B^+$ ions are implanted as a p-type impurity into the n-type high voltage transistor formation region $HV_n$ of the silicon substrate 1. Thus, a first p-type channel region 6 is formed which adjusts a threshold voltage of the transistor in the region $HV_n$.

Thereafter, the first mask pattern 4 is removed.

Figure 1C:
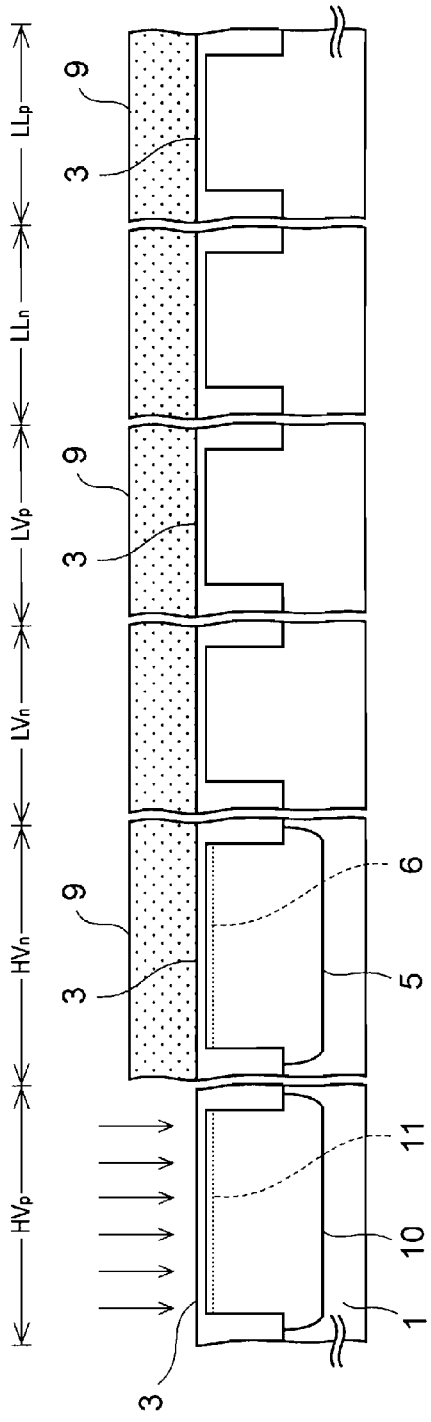

Next, as illustrated in FIG. 1C, photoresist is applied onto the sacrificial insulating film 3. The photoresist is then exposed to light and developed to form a second mask pattern 9 which exposes the p-type high voltage transistor formation region $HV_p$.

Then, a first n well 10 and a first n-type channel region 11 are formed in the p-type high voltage transistor formation region $HV_p$ of the silicon substrate 1 by ion implantation using the second mask pattern 9 as a mask.

Note that, $P^+$ ions are used as an n-type impurity in this step.

Moreover, the first n-type channel region 11 thus formed adjusts a threshold voltage of the transistor to be formed later in the region $HV_p$.

Thereafter, the second mask pattern 9 is removed.

Note that, after the second mask pattern 9 is removed, annealing may be performed to broaden the impurity profiles of the respective wells 5 and 10.

Figure 1D:
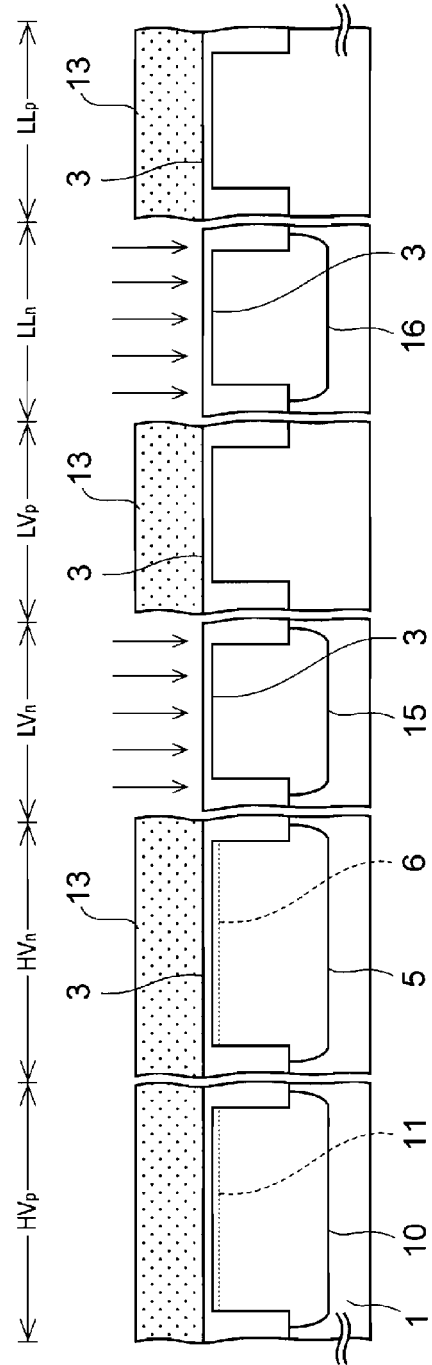

Next, as illustrated in FIG. 1D, photoresist is applied onto the sacrificial insulating film 3. The photoresist is then exposed to light and developed to form a third mask pattern 13.

Subsequently, a p-type impurity such as $B^+$ ions is ion-implanted in the regions $LV_n$ and $LL_n$, which are exposed through the third mask pattern 13. Thus, a second p well 15 and a third p well 16 are formed in these regions of the silicon substrate 1, respectively.

Thereafter, the third mask pattern 13 is removed.

Figure 1E:
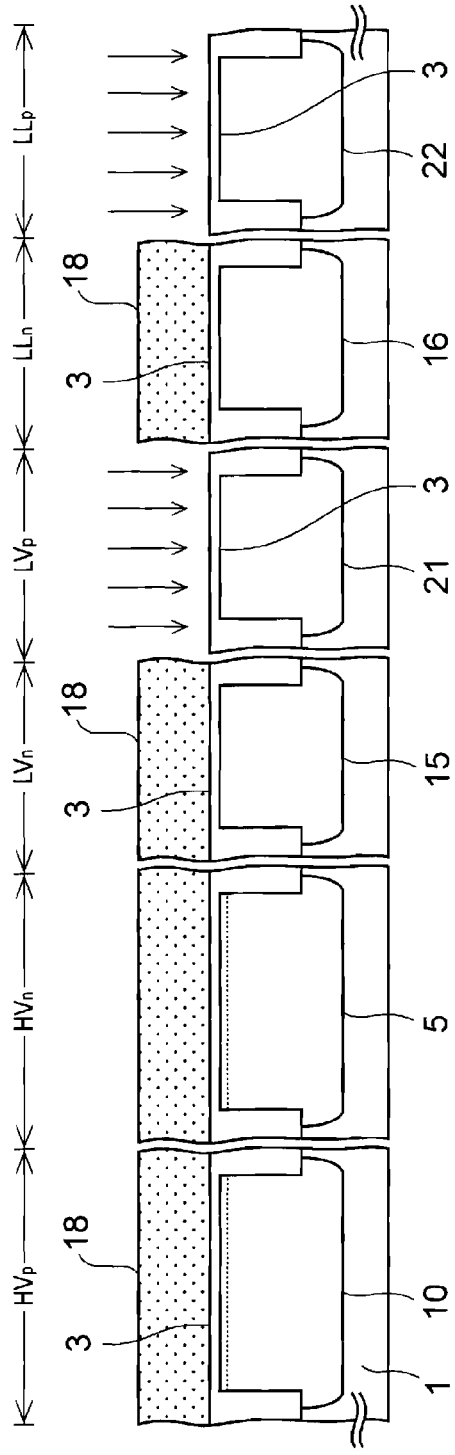

Next, as illustrated in FIG. 1E, a resist pattern is formed as a fourth mask pattern 18 onto the sacrificial insulating film 3. Subsequently, an n-type impurity such as $P^+$ ions is ion-implanted in the regions $LV_p$ and $LL_p$ which are exposed through the fourth mask pattern 18. Thus, a second n well 21 and a third n well 22 are formed in these regions of the silicon substrate 1, respectively.

After the completion of the ion implantation, the fourth mask pattern 18 is removed.

Note that, after the fourth mask pattern 18 is removed, annealing may be performed to broaden the impurity profiles of the respective wells 15, 16, 21, and 22.

Next, the steps performed to obtain a cross-sectional structure illustrated in FIG. 1F will be described.

Firstly, photoresist is applied onto the sacrificial insulating film 3. The photoresist is then exposed to light and developed to form a fifth mask pattern 23 which exposes the n-type low voltage transistor formation region $LV_n$ and the n-type low leak transistor formation region $LL_n$.

Note that, the regions $HV_p$, $HV_n$, $LV_p$, and $LL_p$, except for the regions $LV_n$ and $LL_n$ are covered with the fifth mask pattern 23.

Then, a p-type impurity is ion-implanted into the silicon substrate 1 with the sacrificial insulating film 3 being used as a through film and the fifth mask pattern 23 as a mask. Thus, a second p-type channel region 24 and a third p-type channel region 25 are simultaneously formed in the regions $LV_n$ and $LL_n$ of the silicon substrate 1, respectively.

When the channel regions 24 and 25 are simultaneously formed in the regions $LV_n$ and $LL_n$ with the single mask pattern 22 in this manner, the numbers of mask pattern formation steps and ion implantation steps are reduced compared to the case of forming a mask pattern for each of the channel regions 24 and 25.

Note that, an ion implantation condition in this step is not particularly limited. In this embodiment, the ion implantation is performed under a condition in which $B^+$ ions are used as the p-type impurity, an acceleration energy is 15 keV, a dose amount is $1 \times 10^{13}$ cm$^{-2}$, and a tilt angle is 7°.

Moreover, the channel regions 24 and 25 thus formed can adjust the threshold voltages of the transistors to be formed later in the regions $LV_n$; and $LL_n$ respectively.

Thereafter, the fifth mask pattern 23 is removed.

Figure 1F:
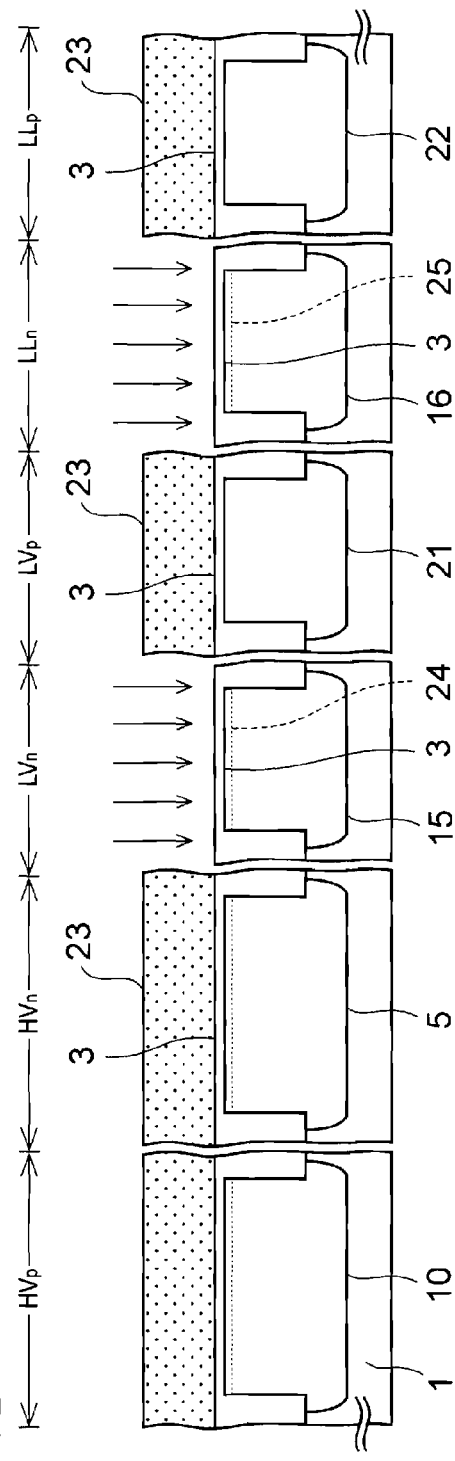
Figure 1G:
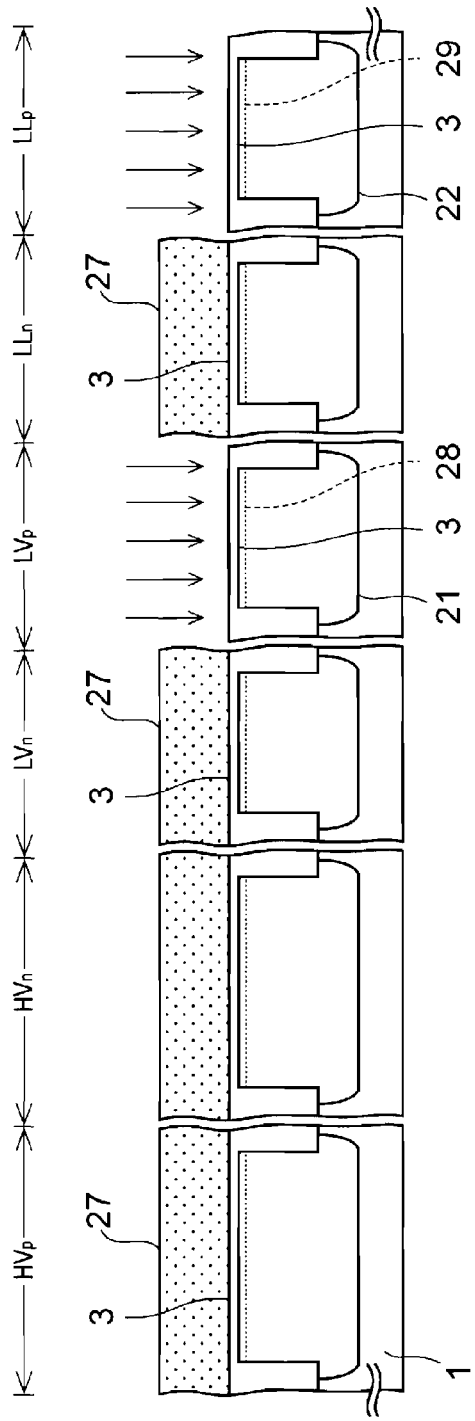

Next, as illustrated in FIG. 1G, a resist pattern is formed as a sixth mask pattern 27 onto the sacrificial insulating film 3.

Then, P⁺ ions are implanted as an n-type impurity in the silicon substrate 1 with the sacrificial insulating film 3 being used as a through film and the sixth mask pattern 27 as a mask. Thus, a second n-type channel region 28 and a third n-type channel region 29 are formed simultaneously in the regions $LV_p$ and $LL_p$ respectively.

In this step as well as in the step of FIG. 1F, the two channel regions 28 and 29 are simultaneously formed with the single mask pattern 27. Accordingly, the numbers of mask pattern formation steps and ion implantation steps are reduced compared to the case of forming a mask pattern for each of the channel regions 28 and 29.

Note that, in this step, an ion implantation condition is employed, for example, in which an acceleration energy is 65 keV, a dose amount is $5.3 \times 10^{13}$ cm$^{-2}$, and a tilt angle is 7°.

These channel regions 28 and 29 are provided to adjust the threshold voltages of the transistors to be formed later in the regions $LV_p$ and $LL_p$, respectively.

Thereafter, the sixth mask pattern 27 is removed.

Figure 1H:
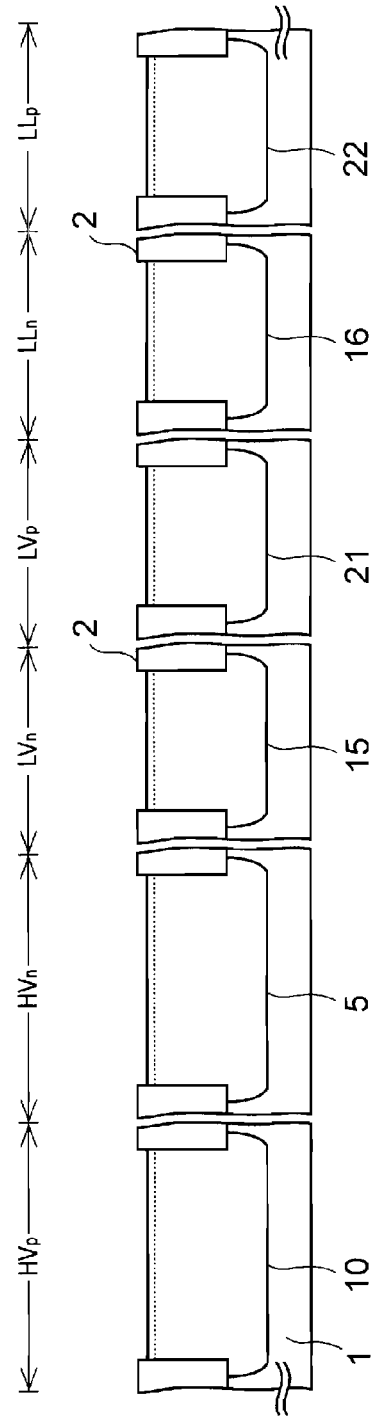

Next, as illustrated in FIG. 1H, the sacrificial insulating film 3 is wet-etched with hydrofluoric acid solution so that the sacrificial insulating film 3 damaged by the above-described ion implantations is removed. Thus, a cleaned surface of the silicon substrate 1 is exposed.

Subsequently, as illustrated in FIG. 1I, the surface of the silicon substrate 1 is subjected to thermal oxidation in oxygen atmosphere and under a condition of substrate temperature of approximately 800° C. Thus, a thermal oxidation film with a thickness of approximately 14 nm to 16 nm is formed as first gate insulating films 31.

Next, as illustrated in FIG. 1J, photoresist is applied over the entire upper surface of the silicon substrate 1. The photoresist is then exposed to light and developed to form a seventh mask pattern 35 covering the regions $HV_p$, and $HV_n$.

Then, the first gate insulating films 31 in the regions $LV_n$, $LV_p$, $LL_n$ and $LL_p$ which are not covered with the seventh mask pattern 35 are removed by wet-etching using hydrofluoric acid solution as an etchant. Thus, a cleaned surface of the silicon substrate 1 is exposed in the regions $LV_n$, $LV_p$, $LL_n$, and $LL_p$.

Thereafter, the seventh mask pattern 35 is removed.

Next, as illustrated in FIG. 1K, the surface of the silicon substrate 1 is subjected to thermal oxidation in oxygen atmosphere, so that second gate insulating films 32 are formed in the low voltage transistor formation regions $LV_n$ and $LV_p$, and at the same time, third gate insulating films 33 are formed in the low leak transistor formation regions $LL_n$ and $LL_p$.

The second gate insulating films 32 and the third gate insulating films 33 are used for transistors using lower operation voltages such as a gate voltage and a drain voltage than the transistor to be formed in the high voltage transistor formation regions $HV_p$ and $HV_n$. Thus, the film thickness of each of the gate insulating films 32 and 33 are preferably smaller than that of the first gate insulating film 31 in the regions $HV_p$ and $HV_n$. In this embodiment, each of the gate insulating films 32 and 33 are formed to a thickness of approximately 1.5 nm to 2.0 nm. Moreover, the substrate temperature in the formation of the gate insulating films 32 and 33 is, for example, 740° C.

Subsequently, as illustrated in FIG. 1L, a polysilicon film is formed to a thickness of approximately 105 nm as a conductive film 36 on the first to third gate insulating films 31 to 33 by the CVD method.

Figure 1M:
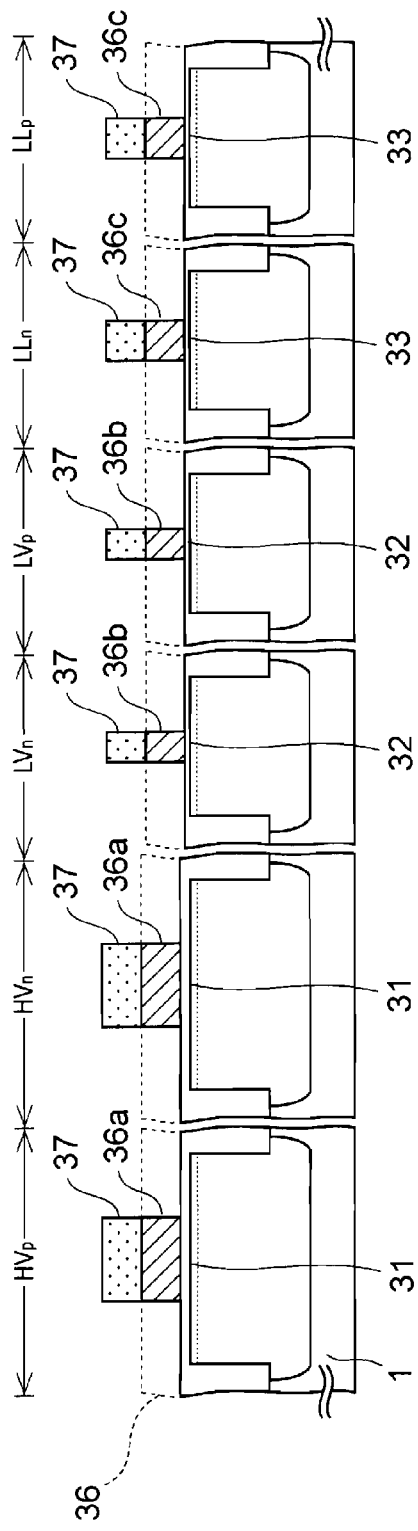

Next, a step performed to obtain a cross-sectional structure illustrated in FIG. 1M will be described.

Firstly, photoresist is applied onto the conductive film 36. The photoresist is then exposed to light and developed to form an eighth mask pattern 37 shaped in a gate electrode.

Then, the conductive film 36 is dry-etched with the eighth mask pattern 37 used as a mask. Thus, first to third gate electrodes 36a to 36c are formed on the first to third gate insulating films 31 to 33.

It is preferable for a gate electrode of a transistor with higher operation voltages such as a gate voltage and a drain voltage to have a longer gate length. Accordingly, in this embodiment, the first gate electrodes 36a formed respectively in the high voltage transistor formation regions $HV_p$ and $HV_n$ have a gate length of approximately 600 nm to 700 nm, which is the longest among the gate electrodes 36a to 36c.

Meanwhile, the second gate electrodes 36b have a gate length of approximately 55 nm to 65 nm, and the third gate electrodes 36c have a gate length of approximately 60 nm to 65 nm.

Thereafter, the eighth resist pattern 37 is removed.

Figure 1N:
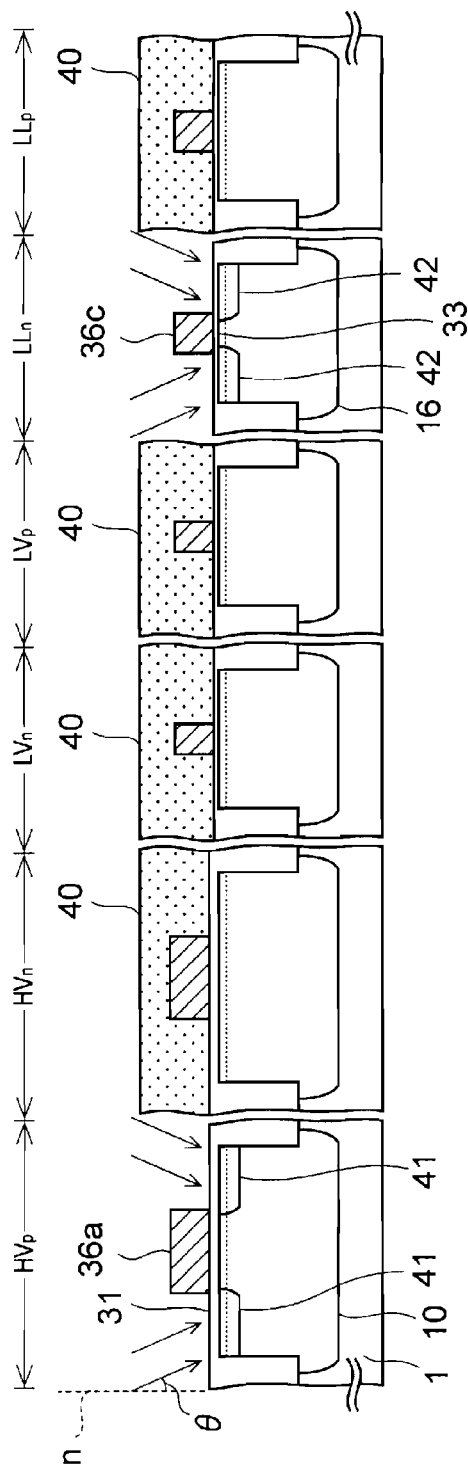

Next, as illustrated in FIG. 1N, photoresist is applied onto the gate insulating films 31 to 33 and the gate electrodes 36a to 36c. The photoresist is then exposed to light and developed to form a ninth mask pattern 40.

The ninth mask pattern 40 is formed in a way that the p-type high voltage transistor formation region $HV_p$ and the n-type low leak transistor formation region $LL_n$ are exposed, and that the regions $HV_n$, $LV_n$, $LV_p$, and $LL_p$, except for the regions $HV_p$, and $LL_n$ are covered with the ninth mask pattern 40.

Then, a p-type impurity (first impurity) is ion-implanted into the silicon substrate 1 in a direction oblique to a normal direction n of the silicon substrate 1 with the ninth mask pattern 40 being used as a mask and the gate insulating films 31 and 33 as through films.

Thus, first p-type source drain extensions 41 are formed in the silicon substrate 1 beside the first gate electrode 36a in the region $HV_p$. In addition, first p-type pocket regions 42 are formed in the silicon substrate 1 beside the third gate electrode 36c in the region $LL_n$.

The first p-type pocket regions 42 are formed also under the third gate electrode 36c, since the ion implantation is performed in the oblique direction as described above. As a result, the concentration of the p-type impurity as a channel impurity under the third gate electrode 36c is increased, so that a short-channel effect can be prevented.

Furthermore, in this embodiment, the ninth mask pattern 40 commonly used for both the first p-type source drain extensions 41 and the first p-type pocket regions 42 is formed, and the regions 41 and 42 are formed simultaneously in one ion implantation using the mask pattern 40. Accordingly, the numbers of mask pattern formation steps and ion implantation steps can be reduced in this embodiment compared to the case of forming the regions 41 and 42 through the ion implantation involving a plurality of operations using different mask patterns.

An ion implantation condition in this step is not particularly limited. In this embodiment, B⁺ ions as the p-type impurity are ion-implanted at four times while the silicon substrate 1 is rotated 90° for each times. Each implantation is performed under a condition in which an acceleration energy is 15 keV, a dose amount is $8 \times 10^{14}$ cm$^{-2}$, and a tilt angle is 28°. Note that the tilt angle θ is an angle between the ion implantation direction and the normal direction n of the silicon substrate 1.

Figure 1O:
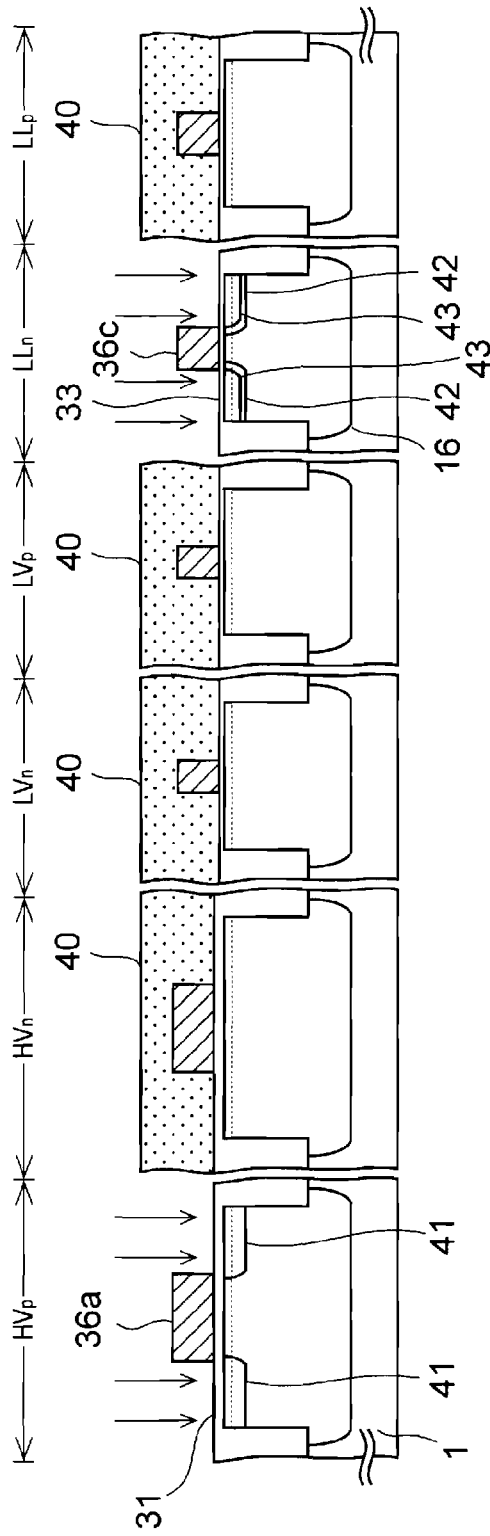

Subsequently, as illustrated in FIG. 1O, the ninth mask pattern 40 is continuously used as a mask without being removed, and P+ ions are ion-implanted as an n-type impurity in the n-type low leak transistor formation region $LL_n$ of silicon substrate 1.

In this ion implantation, the third gate insulating film 33 in the region $LL_n$ functions as a through film, and first n-type impurity regions 43 are formed in the silicon substrate 1 beside the third gate electrode 36c.

Meanwhile, in the p-type high voltage transistor formation region $HV_p$, most of the p+ ions are blocked by the first gate insulating film 31 thicker than the third gate insulating film 33.

Accordingly, the concentration of the P+ ions under the first gate insulating film 31 can be easily made lower than the p-type impurity concentration of the first p-type source drain extensions 41, and hence the p-type impurity concentration is prevented from being excessively diluted by the P+ ions.

An ion implantation condition in this step is not particularly limited. In this embodiment, the P+ ions are implanted into the silicon substrate 1 at four times while the silicon substrate 1 is rotated 90° for each time. Each implantation is performed under a condition in which an acceleration energy is 1 keV, a dose amount is $0.9 \times 10^{14}$ cm$^{-2}$, and a tilt angle is 0°.

Figure 1P:
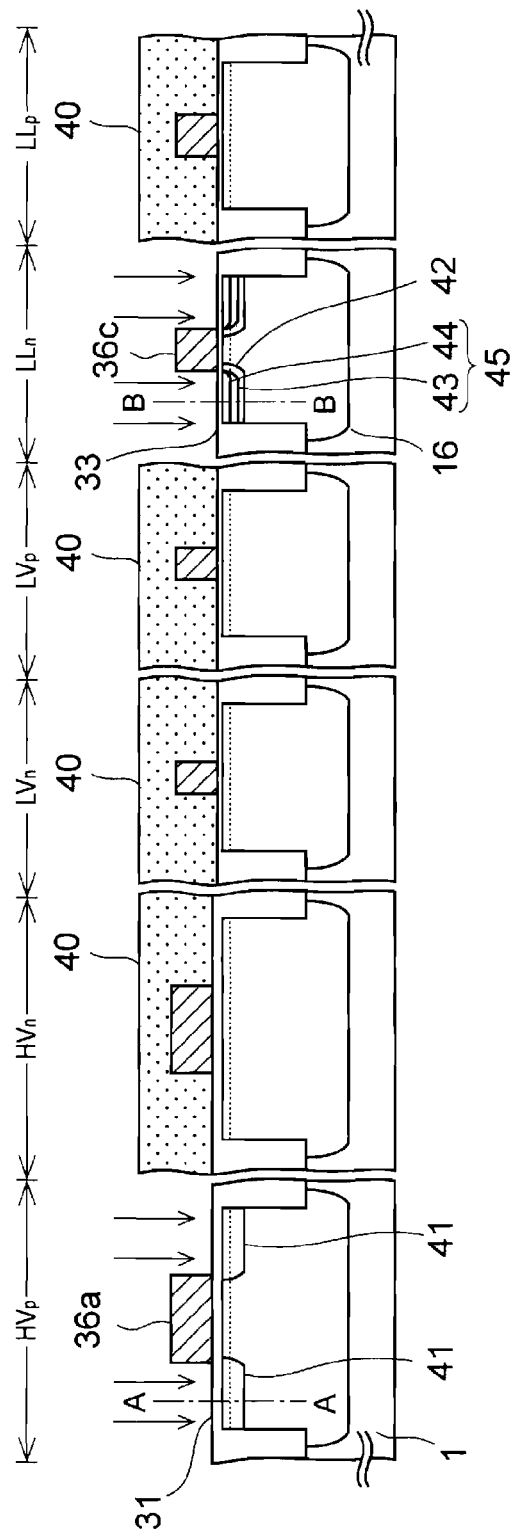

Subsequently, as illustrated in FIG. 1P, the ninth mask pattern 40 is continuously used as a mask without being removed, and As+ ions are implanted as an n-type impurity in the n-type low leak transistor formation region $LL_n$ of silicon substrate 1. Thus, second n-type impurity regions 44 are formed.

As described later, in this ion implantation, it is preferable that As+ ions are implanted into a portion of the silicon substrate 1 at a depth shallower than the implantation depth of the P+ ions in the first n-type impurity regions 43 so that the second n-type impurity regions 44 is formed to be shallower than the first n-type impurity regions 43.

The ion implantation condition is not particularly limited. In this embodiment, the ion implantation is performed at four times while the silicon substrate 1 is rotated 90° for each times. Each implantation is performed under a condition in which an acceleration energy is 1 keV, a dose amount is $1.4 \times 10^{14}$ cm$^{-2}$, and a tilt angle is 0°.

By such ion implantation, first n-type source drain extensions 45 including the n-type impurity regions 43 and 44 are formed in the silicon substrate 1 beside the third gate electrode 36c in the region $LL_n$ to be shallower than the first p-type pocket regions 42.

The n-type impurity concentration of the first n-type source drain extensions 45, which tends to be insufficient only by the first n-type impurity regions 43, can be compensated by forming the two impurity regions 43 and 44 as described above.

Furthermore, the diffusion coefficient of As+ ions implanted in this step is smaller than that of the P+ ions in the first n-type impurity regions 43. Accordingly, As+ ions are prevented from broadly moving in the silicon substrate 1 due to heat applied during the manufacturing of the transistors. Thus, the impurity profile in the first n-type source drain extensions 45 is less likely to be collapsed.

Moreover, the impurity concentration of the first n-type source drain extensions 45 in portions near the interfaces with the p well 16 changes moderately by forming the second n-type impurity regions 44 to be shallower than the first n-type impurity regions 43. Accordingly, when a voltage is applied between the first n-type source drain extension 45 and the p well 16, a potential in a pn junction therebetween changes moderately and the withstanding voltage at the pn junction is improved. Thus, a leak current in the region $LL_n$ is reduced.

Moreover, in this embodiment, the ninth mask pattern 40 which, is a mask used to form the first p-type source drain extensions 41 in the region $HV_p$, is used as it is to form the first n-type source drain extensions 45. Accordingly, the numbers of mask pattern formation steps and ion implantation steps can be reduced compared to the case of forming the regions 41 and 45 individually through the ion implantation involving a plurality of operations using different masks.

Here, As+ ions described above are also implanted into the region $HV_p$ of the silicon substrate 1 to some extent. However, since the first gate insulating film 31 is thicker than the third gate insulating film 33, most of the As+ ions are blocked by the first gate insulating film 31. Accordingly, the concentration of As+ ions under the first gate insulating film 31 can be made lower than the concentration of B+ ions in the p-type source drain extensions 41 by adjusting the acceleration energy and the dose amount. Thus, the p-type impurity concentration of the p-type source drain extensions 41 is prevented from being excessively diluted, while the first n-type source drain extensions 45 are formed in the region $LL_n$.

After the completion of the ion implantation, the ninth mask pattern 40 is removed.

Next, a step performed to obtain a cross-sectional structure illustrated in FIG. 1Q will be described.

Firstly, photoresist is applied onto the gate insulating films 31 to 33. The photoresist is then exposed to light and developed to form a tenth mask pattern 47.

The tenth mask pattern 47 is formed in such a manner that the regions $HV_n$ and $LL_p$ are exposed therethrough, and the regions $HV_p$, $LV_n$, $LV_p$, and $LL_p$ except for the regions $HV_n$ and $LL_p$ are covered with the tenth mask pattern 47.

Then, P+ ions are implanted as an n-type impurity into the regions $HV_n$ and $LL_p$ of the silicon substrate 1 which are not covered with the tenth mask pattern 47 while the implanting direction of the ions are made oblique to the normal direction n of the silicon substrate 1.

Thus, first n-type pocket regions 49 are formed in the region $LL_p$ of the silicon substrate 1 in such a manner that the regions 49 extend from beside the third gate electrode 36c to under the third gate electrode 36c. At the same time, second n-type source drain extensions 48 are formed in the region $HV_n$ of the silicon substrate 1 beside the first gate electrode 36a.

As similar to the step illustrated in FIG. 1N, the two regions 48 and 49 are formed simultaneously by the single mask pattern 47 also in this step. Thus, the numbers of mask pattern formation steps and ion implantation steps can be reduced.

In this embodiment, ion implantation is performed at four times while the silicon substrate 1 is rotated 90° for each times. Each implantation is performed under a condition in which an acceleration energy is 40 keV, a dose amount is $8 \times 10^{14}$ cm$^{-2}$, and a tilt angle $\theta$ is 28°.

Figure 1Q:
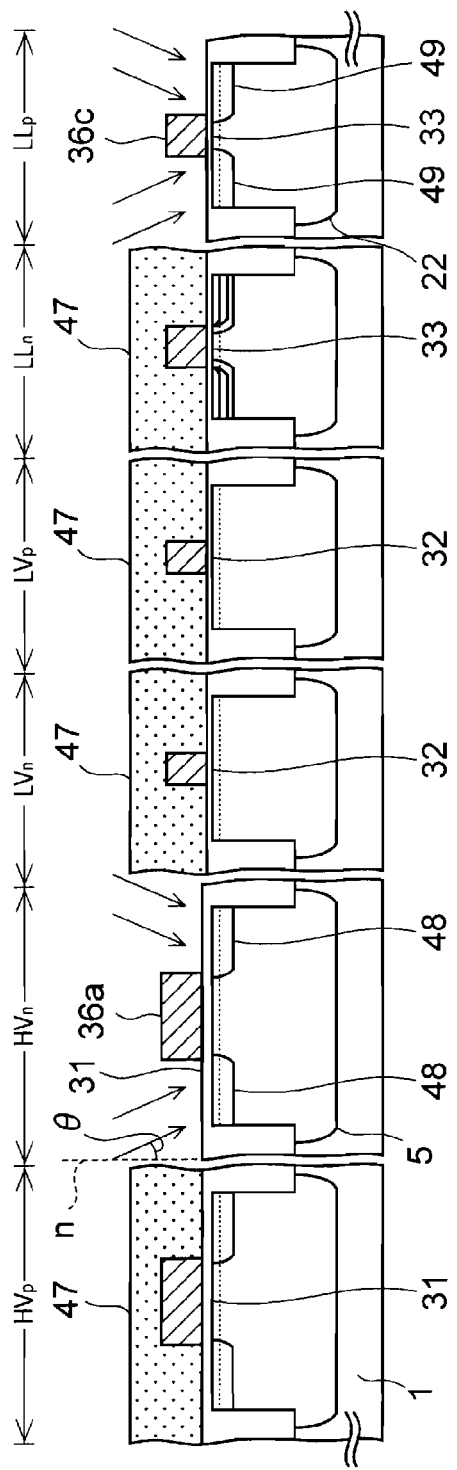
Figure 1R:
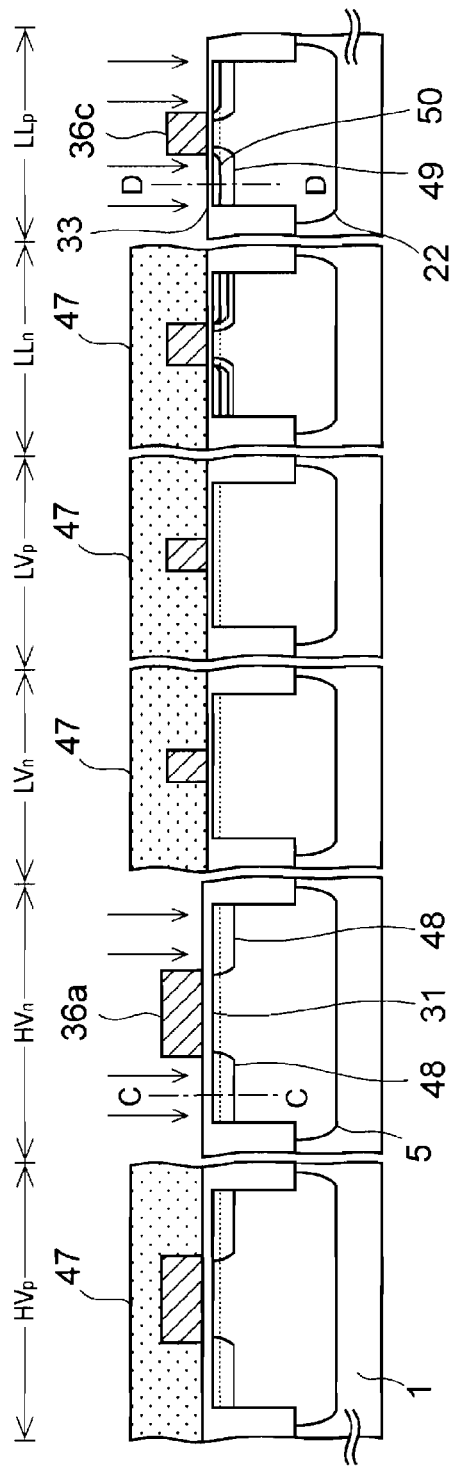

Next, as illustrated in FIG. 1R, the mask pattern 47 is continuously used as a mask, and B+ ions are implanted as a p-type impurity into the silicon substrate 1. Thus, second p-type source drain extensions 50 are formed in the region $LL_p$.

The B+ ions described above are also implanted into the region $HV_n$ of the silicon substrate 1 to some extent.

However, since the first gate insulating film 31 is thicker than the third gate insulating film 33, most of the B+ ions are blocked by the first gate insulating film 31. Accordingly, the concentration of B+ ions under the first gate insulating film 31 can be made lower than the concentration of P+ ions in the n-type source drain extensions 48 by adjusting the acceleration energy and the dose amount. Thus, the n-type impurity concentration of the n-type source drain extensions 48 is prevented from being excessively diluted while the second p-type source drain extensions 50 are formed in the region $LL_p$.

In this embodiment, the ion implantation is performed at four times while the silicon substrate 1 is rotated 90° for each times, under a condition in which an acceleration energy is 0.3 keV, a dose amount is $1 \times 10^{14}$ cm$^{-2}$, and a tilt angle is 0°. Thus, the second p-type source drain extensions 50 described above are formed.

Furthermore, by using the tenth mask pattern 47 used to form the first n-type pocket regions 49 and the like in the step of FIG. 1Q in this step, the number of mask formation steps can be reduced.

After the completion of the ion implantation, the tenth mask pattern 47 is removed.

Figure 1S:
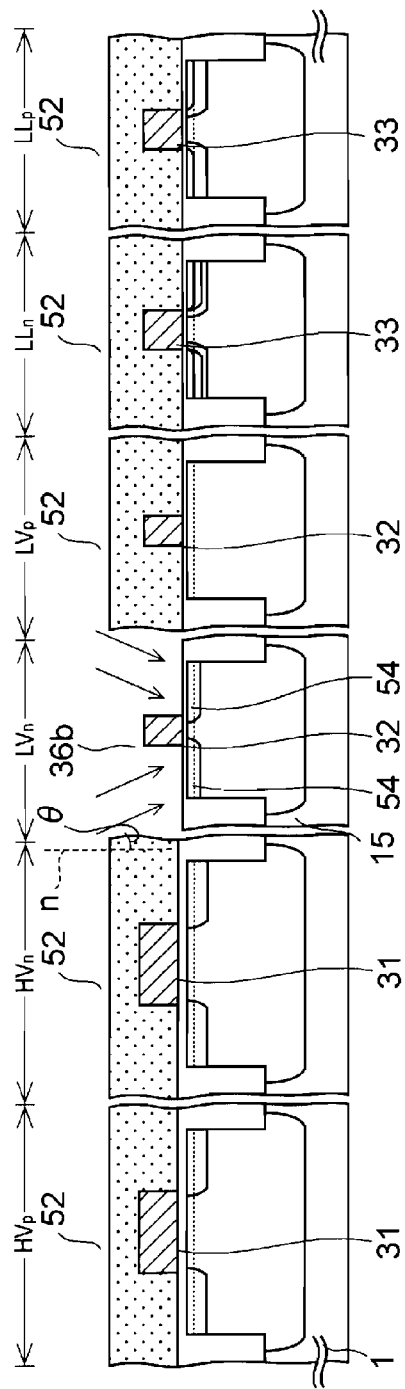

Next, as illustrated in FIG. 1S, a resist pattern is formed on the gate insulating films 31 to 33 as eleventh mask pattern 52.

Then, In$^+$ ions are implanted as a p-type impurity into the region $LV_n$ of the silicon substrate 1 in a direction oblique to the normal direction n with the eleventh mask pattern 52 being used as a mask. Thus, second p-type pocket regions 54 are formed beside the second gate electrode 36b.

This ion implantation is performed under a condition, for example, in which an acceleration energy is 40 keV, a dose amount is $8.0 \times 10^{12}$ cm$^{-2}$, and a tilt angle is 28°. Under this condition, the ion implantation is performed at four times, while the silicon substrate 1 is rotated 90° for each times. Thus, the second p-type pocket regions 54 are formed.

In$^+$ ions implanted in this step has a larger mass than B$^+$ ions, and the diffusion coefficient of In$^+$ ions in silicon is smaller than that of B$^+$ ions. Accordingly, In$^+$ ions are less likely to diffuse in a lateral direction in the silicon substrate 1. For example, when the substrate temperature is 1000° C., the diffusion coefficient of In$^+$ ions in silicon is $7.5 \times 10^{-15}$ cm$^{-2}$/s, which is smaller than the diffusion coefficient ($2.0 \times 10^{-14}$ cm$^{-2}$/s) of B$^+$ ions in silicon.

Thus, the concentration profile of the second p-type pocket regions 54 in the lateral direction of the substrate can be made steeper in this embodiment than the case of using B$^+$ ions as an impurity for the second p-type pocket regions 54. Thus, a short channel effect in the region $LV_n$ is effectively prevented. As a result, a threshold voltage of the transistor to be formed in the region $LV_n$ can be made lower. Hence, increase in speed of the transistor can be achieved.

Figure 1T:
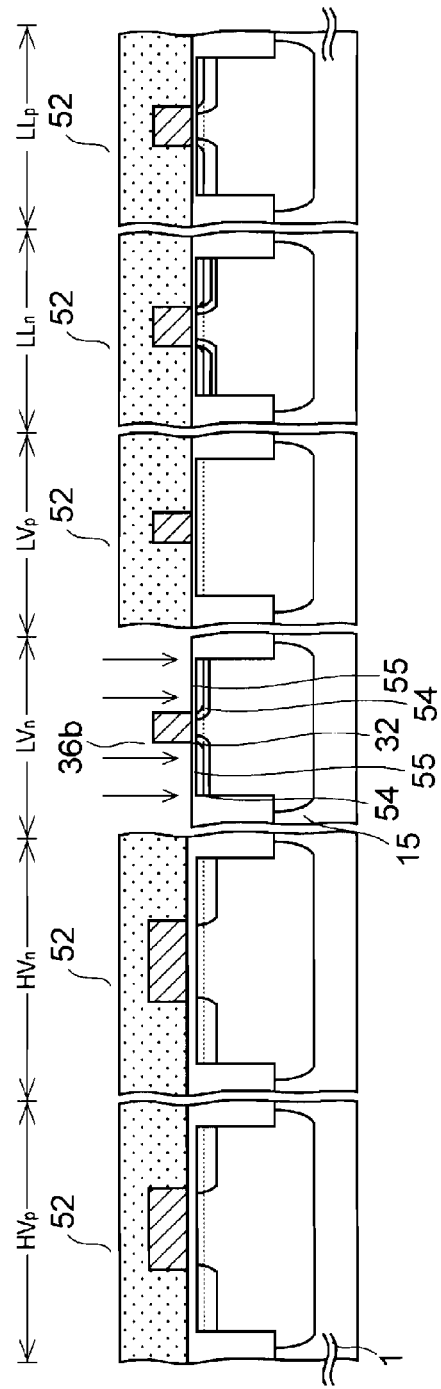

Next, as illustrated in FIG. 1T, the eleventh mask pattern 52 described above is continuously used as a mask, and As$^+$ ions are implanted as an n-type impurity into the region $LV_n$ of the silicon substrate 1.

Such an ion implantation condition is employed in this embodiment in which an acceleration energy is 1 keV, a dose amount is $2.7 \times 10^{14}$ cm$^{-2}$, and a tilt angle is 0°. Under this condition, the ion implantation is performed at four times while the silicon substrate 1 is rotated 90° for each time. Thus, third n-type source drain extensions 55 are formed in the silicon substrate 1 beside the second gate electrode 36b.

Thereafter, the eleventh mask pattern 52 is removed.

Next, as illustrated in FIG. 1U, photoresist is applied onto the gate insulating films 31 to 33. The photoresist is then exposed to light and developed to form a twelfth mask pattern 57.

Thereafter, As$^+$ ions are implanted at four time as an n-type impurity into the region $LV_p$ of the silicon substrate 1 with the twelfth mask pattern 57 being used as a mask, at an acceleration energy of 60 keV, a dose amount of $6 \times 10^{12}$ cm$^{-2}$, and a tilt angle θ of 28°. Note that, each implantation is performed while the silicon substrate 1 is rotated 90° for each time.

By such ion implantation, second n-type pocket regions 58 are formed in the silicon substrate 1 beside the second gate electrode 36b.

Then, as illustrated in FIG. 1V, the twelfth mask pattern 57 described above is continuously used as a mask, and a p-type impurity is ion-implanted in the silicon substrate 1 beside the second gate electrode 36b in the region $LV_p$. Thus, third p-type source drain extensions 59 are formed.

An ion implantation condition is not particularly limited. In this embodiment, B$^+$ ions are employed as the p-type impurity and are implanted at four times while the silicon substrate 1 is rotated 90° for each time. Each implantation is performed under a condition, for example, in which an acceleration energy is 0.3 keV, a dose amount is $1.0 \times 10^{14}$ cm$^{-2}$, and a tilt angle is 0°.

Thereafter, the twelfth mask pattern 57 is removed.

Figure 1W:
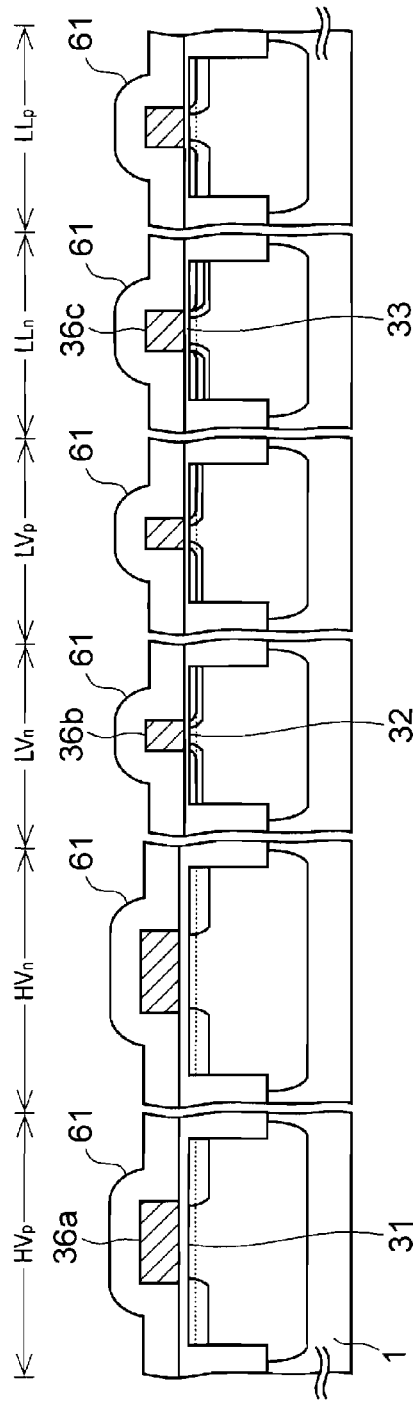

Subsequently, as illustrated in FIG. 1W, an insulating film 61 is formed on an entire upper surface of the silicon substrate 1. The insulating film 61 is, for example, a silicon oxide film formed by the CVD method.

Figure 1X:
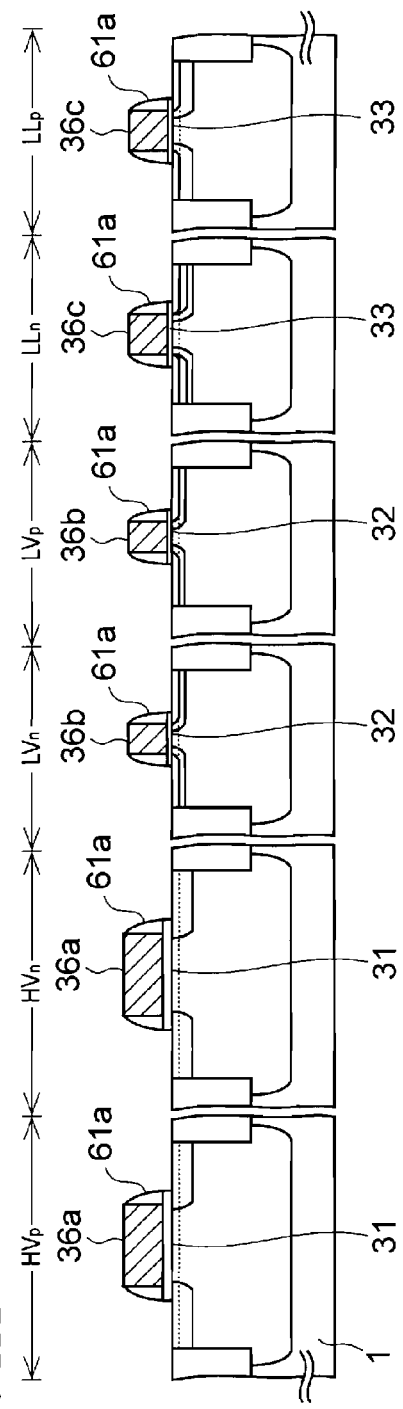

Then, as illustrated in FIG. 1X, the insulating film 61 is etched back to leave as insulation side walls 61a at both sides of the gate electrodes 36a to 36c.

Figure 1Y:
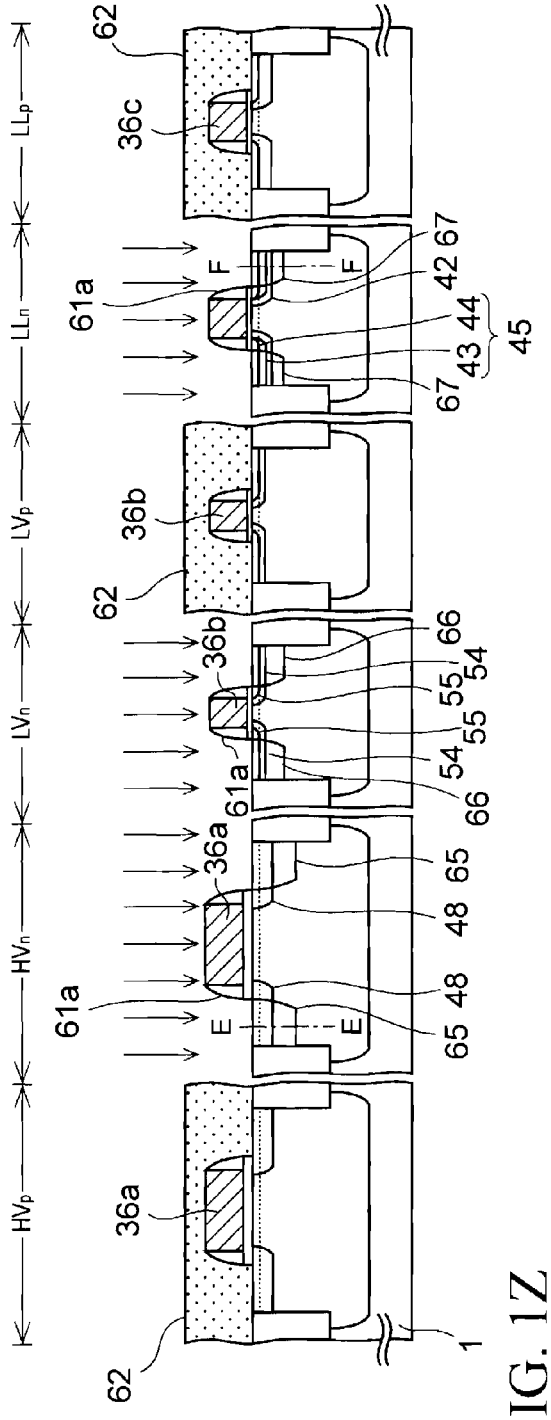

Next, as illustrated in FIG. 1Y, photoresist is applied onto the entire upper surface of the silicon substrate 1. The photoresist is then exposed to light and developed to form a thirteenth mask pattern 62.

Then, P$^+$ ions are implanted as an n-type impurity in the regions $HV_n$, $LV_n$, and $LL_n$ with the thirteenth mask pattern 62 being used as a mask. Thus, first to third n-type source drain regions 65 to 67 are formed in these regions.

After the completion of the ion implantation, the thirteenth mask pattern 62 is removed.

Figure 1Z:
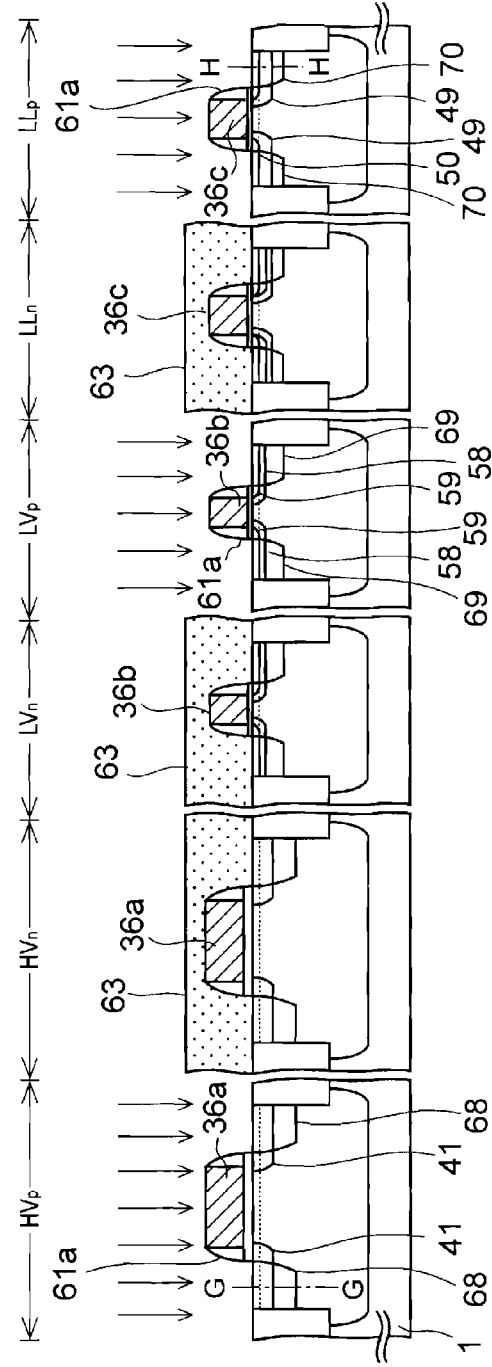

Next, as illustrated in FIG. 1Z, photoresist is applied on the entire upper surface of the silicon substrate 1 in a manner similar to the thirteenth mask pattern 62 described above. The photoresist is then exposed to light and developed to form a fourteenth mask pattern 63.

Then, B$^+$ ions are implanted as a p-type impurity in the regions $HV_p$, $LV_p$, and $LL_p$, with the fourteenth mask pattern 63 being used as a mask. Thus, first to third p-type source drain regions 68 to 70 are formed in these regions.

Thereafter, the fourteenth mask pattern 63 is removed.

Figure 2A:
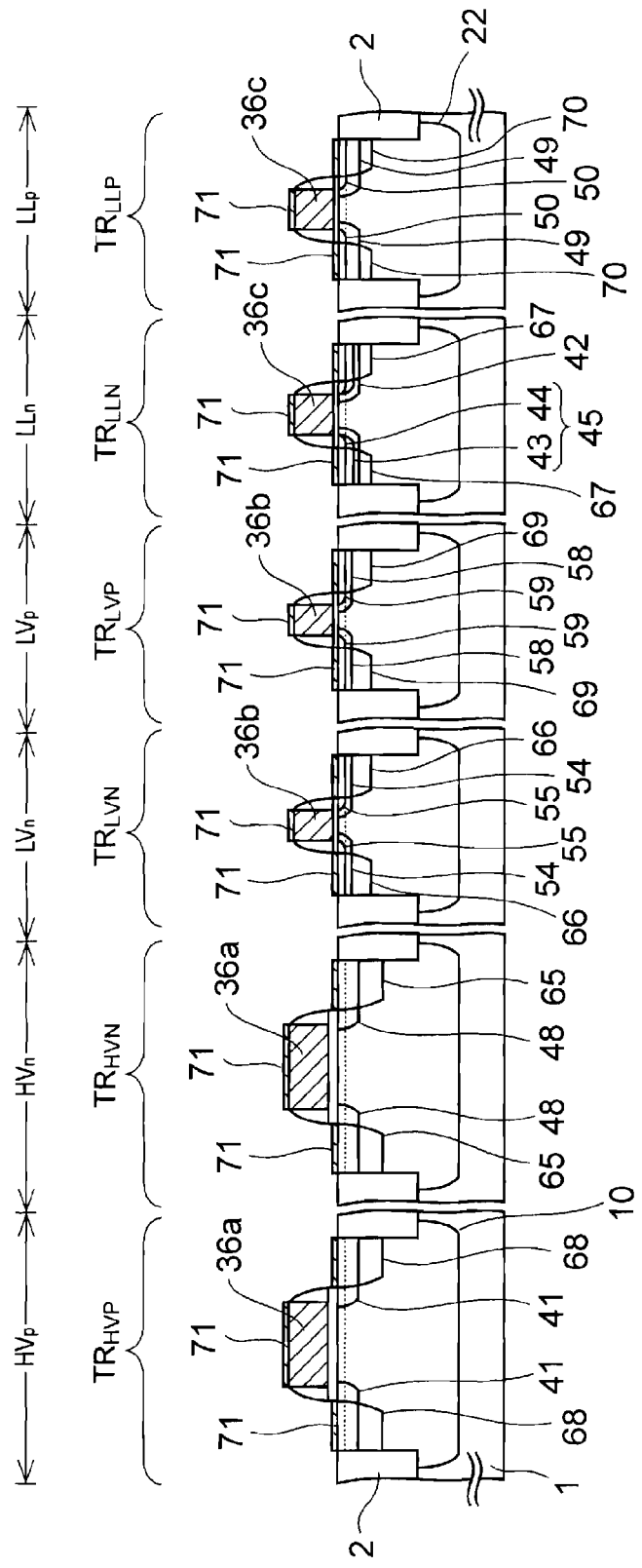

Next, as illustrated in FIG. 2A, a cobalt film is formed as a refractory metal film on the entire upper surface of the silicon substrate 1 by the sputtering method. The cobalt film is annealed to react with silicon, and thus a refractory metal silicide film 71 is formed on each of the source drain regions 65 to 70.

The refractory metal silicide film 71 is also formed on a surface layer of each of the gate electrodes 36a to 36c. Thus, the resistances of the respective gate electrodes 36a to 36c can be reduced.

Thereafter, an unreacted portion of the cobalt film on the element isolation insulating film 2 is removed by wet etching.

By performing the steps described so far, basic structures of a p-type high voltage MOS transistor $TR_{HVP}$ and an n-type high voltage MOS transistor $TR_{HVN}$ are completed in the regions $HV_p$ and $HV_n$ of the silicon substrate 1, respectively.

In addition, basic structures of a p-type low voltage MOS transistor $TR_{LVP}$ and an n-type high voltage MOS transistor $TR_{LVN}$ are completed in the regions $LV_p$ and $LV_n$, respectively.

Furthermore, basic structures of an n-type low leak MOS transistor $TR_{LLN}$ and a p-type low leak MOS transistor $TR_{LLP}$ are completed in the regions $LL_n$ and $LL_p$, respectively.

Figure 2B:
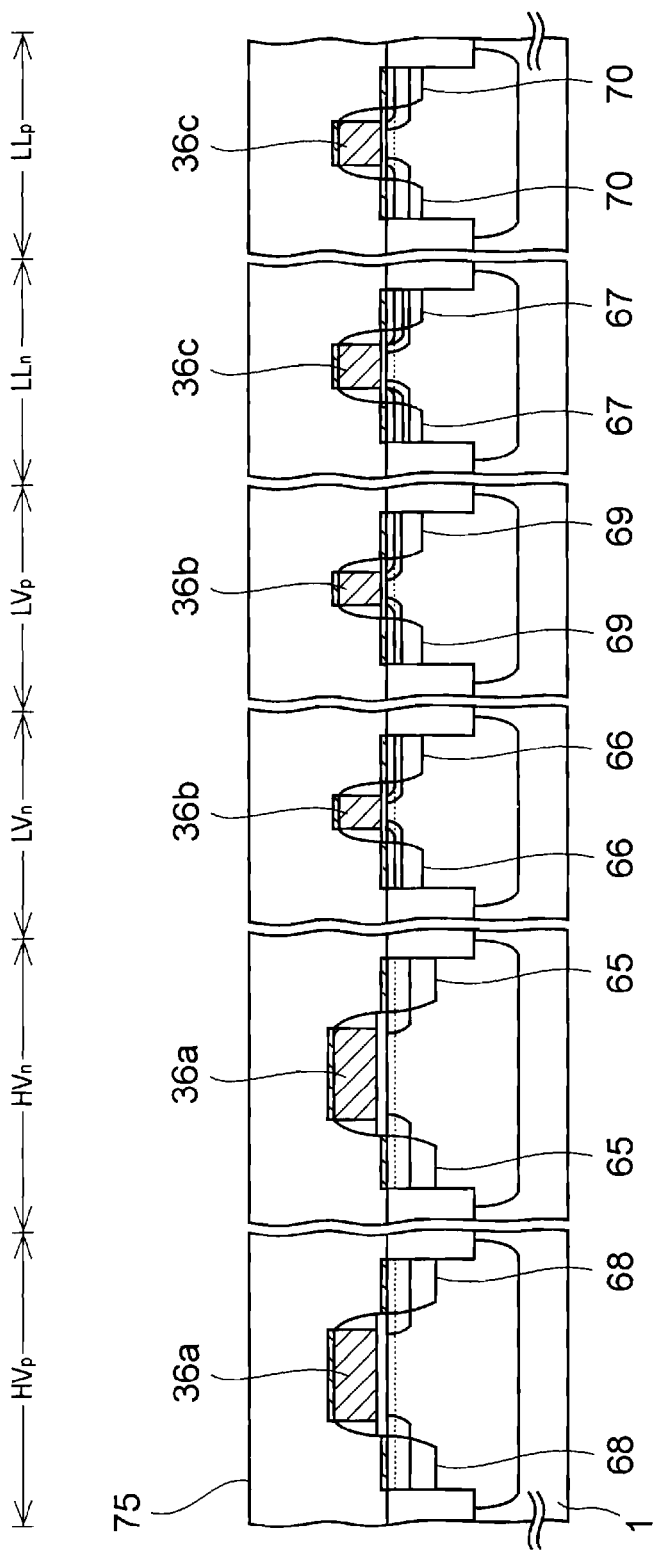

Next, as illustrated in FIG. 2B, a silicon oxide film is formed as an interlayer insulating film 75 on the entire upper surface of the silicon substrate 1 by the CVD method.

Then, an upper surface of the interlayer insulating film 75 is polished and planarized by the CMP method to remove unevenness formed on the upper surface of the interlayer insulating film 75, the unevenness reflecting the gate electrodes 36a to 36c.

Figure 2C:
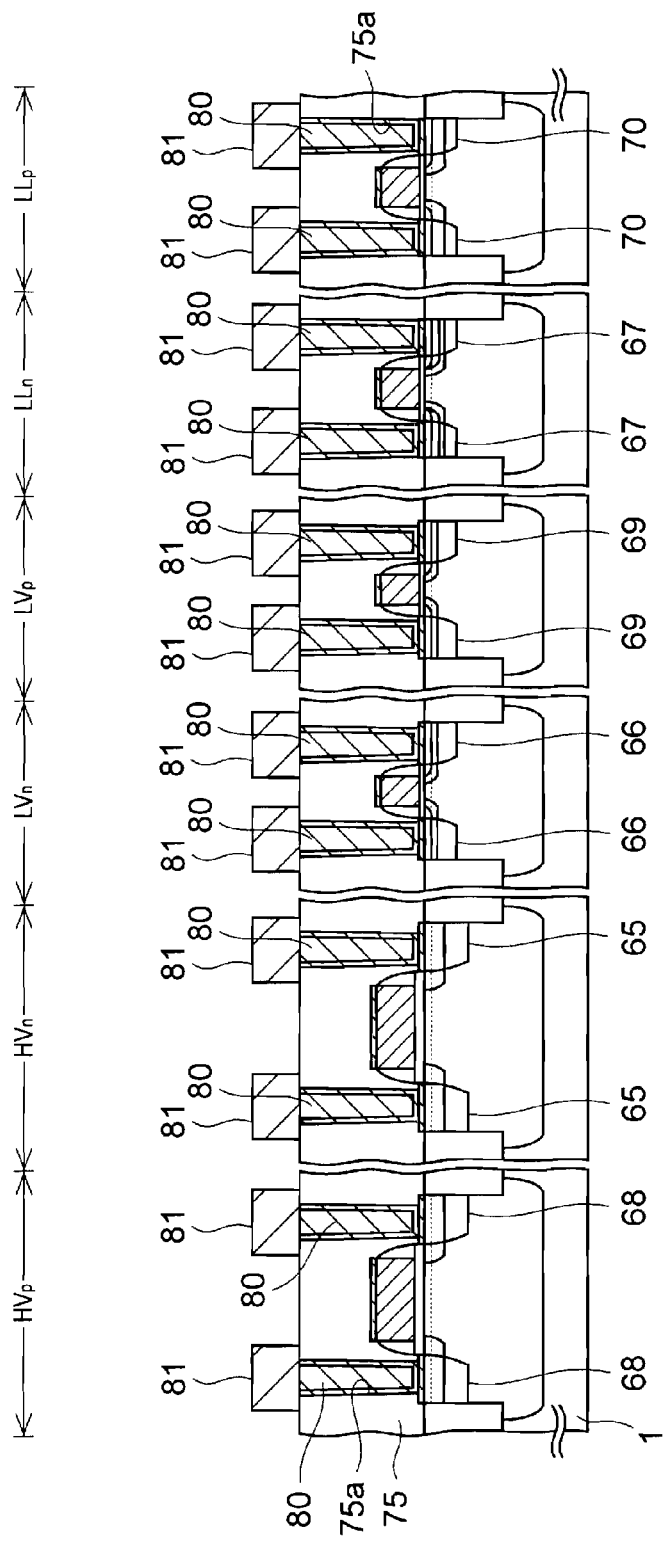

Next, a step performed to obtain a cross-sectional structure illustrated in FIG. 2C will be described.

Firstly, the interlayer insulating film 75 is patterned to form a contact hole 75a over each of the source drain regions 65 to 70.

Next, a titanium film and a titanium nitride film are formed in this order on inner surfaces of the contact holes 75a and the upper surface of the interlayer insulating film 75 by the sputtering method. The titanium film and a titanium nitride film thus formed serve as glue films.

Thereafter, a tungsten film is formed on the glue film by the CVD method to fill in the contact holes 75a. Then, excessive portions of the glue film and the tungsten film on the interlayer insulating film 75 are polished and removed by the CMP method. As a result, the tungsten film and glue film are left in the contact holes 75a as conductive plugs 80.

Thereafter, a metal stacked film including an aluminum film is formed on the interlayer insulating film 75 and the conductive plugs 80 by the sputtering method. Thereafter, the metal stacked film is patterned to form metal wirings 81.

Thus, a basic structure of the semiconductor device according to the present embodiment is completed.

As illustrated in FIG. 2A, in this semiconductor device, the plurality of types of MOS transistors $TR_{HVP}$, $TR_{HVN}$, $TR_{LVP}$, $TR_{LVN}$, $TR_{LLP}$, and $TR_{LLN}$ are formed on the silicon substrate 1, the MOS transistors having different operation voltages and different operation speeds from each other.

In this embodiment, even when a plurality of types of transistors are formed in this manner, different types of transistors having impurity regions with the same conductivity type are formed in the same ion implantation step using the same mask pattern. Thus, the number of steps can be reduced compared to the case where the impurity regions are formed individually.

The first p-type source drain extensions 41 and the first p-type pocket regions 42 illustrated in FIG. 1N can be given as an example of impurity regions with the same conductivity type formed in the same ion implantation step.

Moreover, in this embodiment, as illustrated in FIGS. 1O and 1P, the ninth mask pattern 40 used to form the regions 41 and 42 are continuously used as it is to form the first n-type source drain extension 45 by implanting ions of the n-type impurity in the region $LL_n$.

At this time, in the region $HV_p$, the implantation of the n-type impurity in the region $HV_p$ is more likely to be prevented by the first gate insulating film 31 that is thicker than the third gate insulating film 33 in the region $LL_n$. Thus, excessive implantation of the n-type impurity can be prevented in the region $HV_p$ by adjusting the acceleration energy and the dose amount in this step.

Figure 3B:
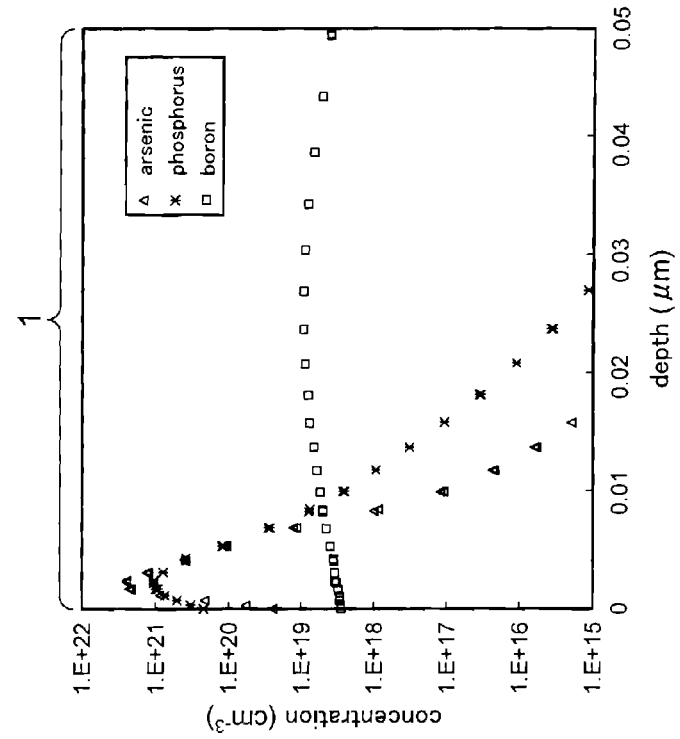
FIG. 3B is a graph illustrating a simulation result of impurity concentration profiles along a B-B line of FIG. 1P.
Figure 3A:
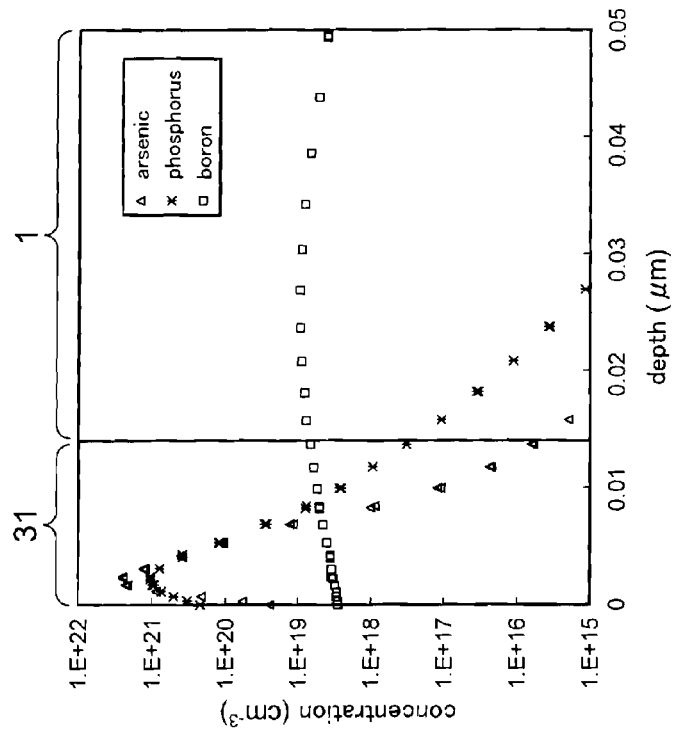
FIG. 3A is a graph illustrating a simulation result of impurity concentration profiles along an A-A line of FIG. 1P.

FIG. 3A is a graph illustrating a simulation result of impurity concentration profiles along an A-A line of FIG. 1P.

FIG. 3B is a graph illustrating a simulation result of impurity concentration profiles along a B-B line of FIG. 1P.

In FIGS. 3A and 3B, "boron" is the one that is ion-implanted in the step of FIG. 1N, and is used as the p-type impurity for the first p-type source drain extensions 41 and the first p-type pocket regions 42.

Meanwhile, "phosphorus" is the one that is ion-implanted in the step of FIG. 1O, and "arsenic" is the one that is ion-implanted in the step of FIG. 1P. As described above, these impurities are used as the n-type impurities for the first and second n-type impurity regions 43 and 44, respectively. Then, the first n-type source drain extensions 45 are formed of these regions 43 and 44.

As illustrated in FIG. 3A, most of "phosphorus" and "arsenic" are blocked by the thick first gate insulating film 31. Accordingly, in the silicone substrate 1 under the first gate insulating film 31, the concentrations of "phosphorus" and "arsenic" are lower than the concentration of "boron."

Thus, it is ascertained that the p-type impurity concentration of the first p-type source drain extensions 41 is not excessively diluted by "phosphorus" and "arsenic" which are n-type impurities, even when the ninth mask pattern 40 is used in all the steps of FIGS. 1N to 1P as described above.

As a result, the conductivity type of the first p-type source drain extensions 41 can be maintained as the p-type, while omitting a mask pattern formation step.

With the same reason described above, the numbers of mask pattern formation steps and ion implantation steps can be reduced by forming the second n-type source drain extensions 48 and the first n-type pocket regions 49 in the same ion implantation in the step of FIG. 1Q.

Furthermore, as illustrated in FIG. 1R, the mask pattern formation step can be omitted by forming the second p-type source drain extensions 50 with the tenth mask pattern 47 used to form the regions 48 and 49.

Figure 4B:
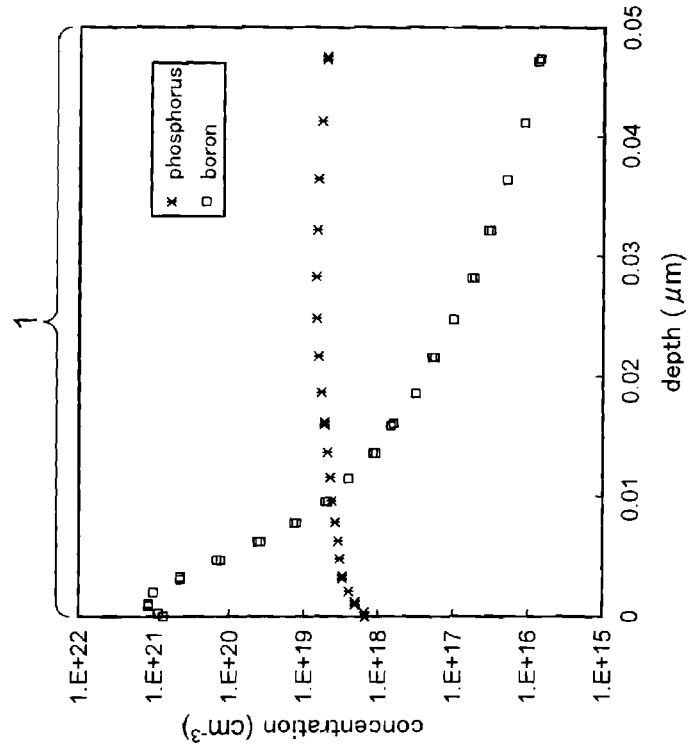
FIG. 4B is a graph illustrating a simulation result of impurity concentration profiles along a D-D line of FIG. 1R.
Figure 4A:
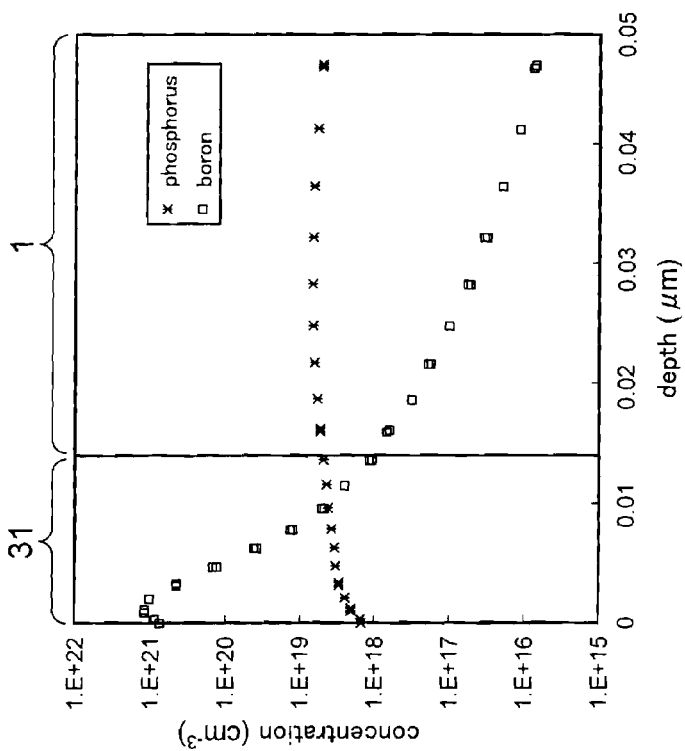
FIG. 4A is a graph illustrating a simulation result of impurity concentration profiles along a C-C line of FIG. 1R.

FIG. 4A is a graph illustrating a simulation result of impurity concentration profiles along a C-C line of FIG. 1R.

FIG. 4B is a graph illustrating a simulation result of impurity concentration profiles along a D-D line of FIG. 1R.

In FIGS. 4A and 4B, "phosphorus" is the one that is ion-implanted in the step of FIG. 1Q, and is used as the n-type impurity for the second n-type source drain extensions 48 and the first n-type pocket regions 49.

On the other hand, "boron" is the one that is ion-implanted in the step of FIG. 1R, and is used as the p-type impurity for the second p-type source drain extensions 50.

As illustrated in FIG. 4A, most of "boron" is blocked by the thick first gate insulating film 31.

Accordingly, in the silicone substrate 1 under the first gate insulating film 31, the concentration of the impurity "boron" is lower than the concentration of "phosphorus".

Accordingly, the conductivity type of the second n-type source drain extension 48 can be maintained at the n-type even when the tenth mask pattern 47 is used in both the steps of FIGS. 1Q and 1R.

In contrast, as illustrated in FIG. 1S, the second p-type pocket regions 54 in the region $LV_n$ are formed in the step different from the steps for forming the impurity regions of the other transistors.

In the step of FIG. 1S, $In^+$ ions are implanted as the p-type impurity into the silicon substrate 1 to form the second p-type pocket regions 54.

As described above, $In^+$ ions make the impurity concentration profile in the second p-type pocket regions 54 in the lateral direction of the substrate steep, and contribute to increasing the speed of the transistor $TR_{LVN}$ (see FIG. 2A). Such increase in speed has practical benefits particularly in a generation of a gate length of 90 nm or less, for example, a 65 nm generation, in which a finer design is desired in addition to increase in operation speed.

Making the concentration profile steep is advantageous for increasing the speed of the transistor, but is disadvantageous for increasing the withstanding voltage of the transistor.

For example, when In$^+$ ions are used as the p-type impurity for the first p-type source drain extensions 41 of the p-type high voltage MOS transistor TR$_{HVP}$ (see FIG. 2A), the impurity profile in the extensions 41 in the lateral direction of the substrate becomes steeper than the case of using B$^+$ ions.

Accordingly, when a voltage is applied between the extension 41 and the n well 10, the potential at the pn junction therebetween changes abruptly, and a breakdown is more likely to occur at the pn junction.

Thus, from a view point of maintaining the withstanding voltage of the transistor TR$_{HVP}$, it is preferable to form the second p-type pocket regions 54 in the region LV$_n$ in a step different from the step of forming the first p-type source drain extensions 41 in the region LV$_p$, as in this embodiment.

In addition, making the impurity concentration steep by In$^+$ ions as described above is disadvantageous in reducing the leak current of the transistor.

For example, when In$^+$ ions are used as the p-type impurity for the second p-type source drain extensions 50 of the p-type low leak MOS transistor TR$_{LLP}$ (see FIG. 2A), the impurity profile in the extensions 50 becomes steeper than the case of using B$^+$ ions. Accordingly, when a voltage is applied between the extension 50 and the n well 22, the potential at the pn junction therebetween changes abruptly, and it is more likely that a breakdown occurs at the pn junction thereby causing a leak current to occur.

Thus, from a view point of maintaining the leak current of the transistor TR$_{LLP}$ at a low value, it is preferable to form the second p-type pocket regions 54 in the region LV$_n$ in a step different from the step of forming the second p-type source drain extensions 50 in the region LL$_p$, as in this embodiment.

Determining whether a mask pattern is to be used for a plurality of transistors depending on the electrical characteristics of the transistors as described above can reduce the number of steps, while maintaining the high speed operation capability of the transistor TR$_{LVN}$, the high withstanding voltage of the transistor TR$_{HVP}$, and the low leak characteristic of the transistor TR$_{LLP}$.

Note that, as illustrated in FIG. 1Y, the first to third n-type source drain regions 65 to 67 are formed in the same step, which also achieves reduction in the number of steps.

Figure 5B:
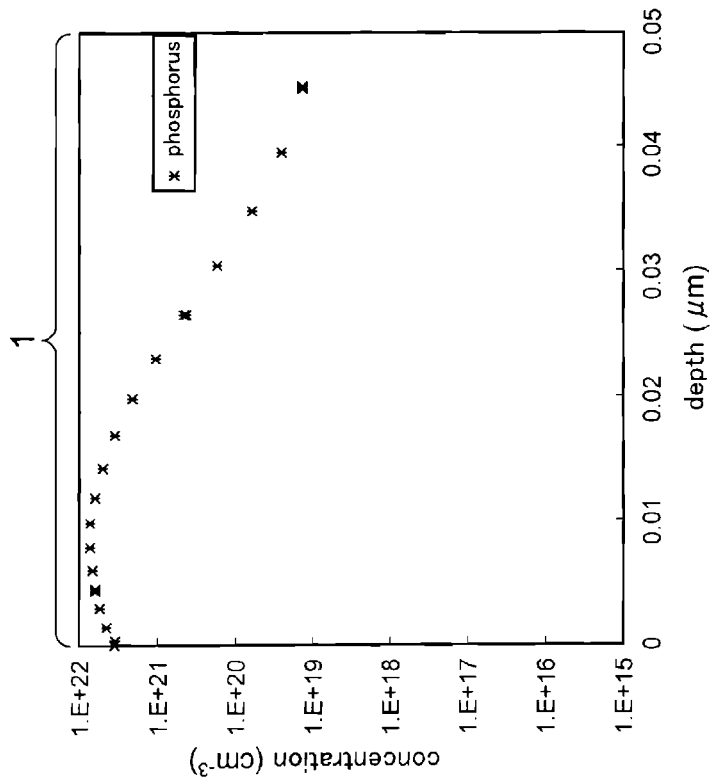
FIG. 5B is a graph illustrating a simulation result of impurity concentration profiles of a third n-type source drain region along an F-F line of FIG. 1Y.
Figure 5A:
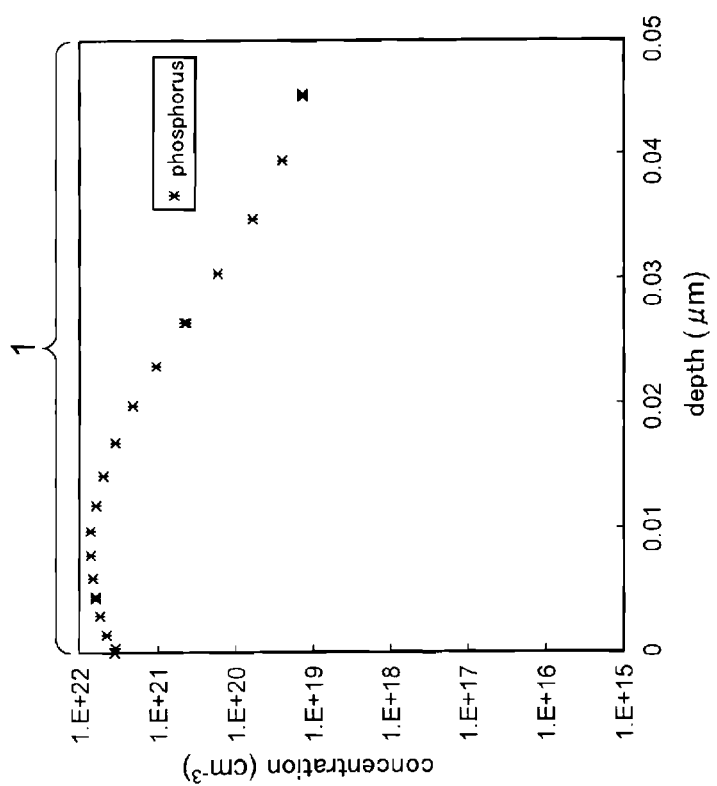
FIG. 5A is a graph illustrating a simulation result of impurity concentration profiles of a first n-type source drain region along an E-E line of FIG. 1Y.

FIG. 5A is a simulation result of impurity concentration profiles of a first n-type source drain region 65 along an E-E line of FIG. 1Y. FIG. 5B is a simulation result of impurity concentration profiles of a third n-type source drain region 67 along an F-F line of FIG. 1Y.

Since the regions 65 and 67 are formed in the same step, the concentration profiles of the n-type impurity (phosphorous) implanted into the regions 65 and 67 are approximately the same as shown in FIGS. 5A and 5B.

Note that, in the step illustrated in FIG. 1Z, the first to third p-type source drain regions 68 to 70 are formed in the same step, which also achieves reduction in the number of steps.

Figure 6B:
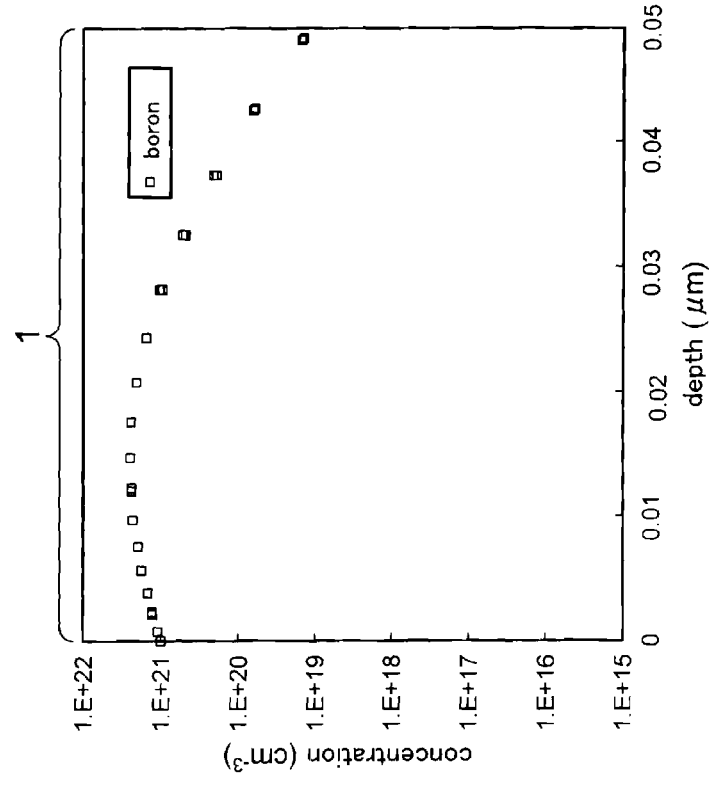
FIG. 6B is a graph illustrating a simulation result of impurity concentration profiles of a third p-type source drain region along an H-H line of FIG. 1Z.
Figure 6A:
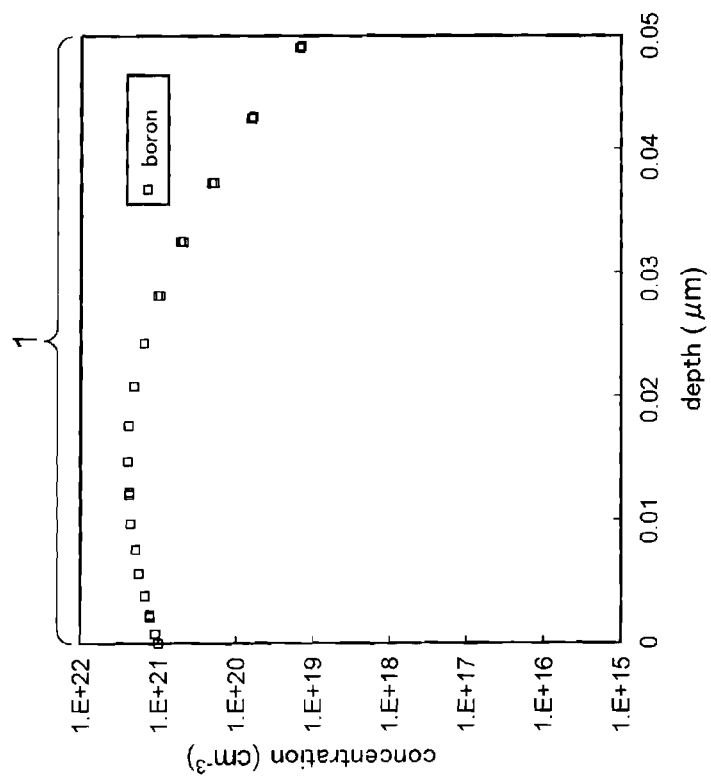
FIG. 6A is a graph illustrating a simulation result of impurity concentration profiles of a first p-type source drain region along a G-G line of FIG. 1Z.

FIG. 6A is a simulation result of impurity concentration profiles of a first p-type source drain region 68 along a G-G line of FIG. 1Z. FIG. 6B is a simulation result of impurity concentration profiles of a third p-type source drain region 70 along an H-H line of FIG. 1Z Since the regions 68 and 70 are formed in the same step, the concentration profiles of the p-type impurity (boron) implanted into the regions 68 and 70 are approximately the same as shown in FIGS. 6A and 6B.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:

forming a first gate insulating film in a first region of a semiconductor substrate;

forming a second gate insulating film in a second region of the semiconductor substrate, the second gate insulating film being thinner than the first gate insulating film;

forming a third gate insulating film in a third region of the semiconductor substrate, the third gate insulating film being thinner than the first gate insulating film;

forming a first gate electrode, a second gate electrode, and a third gate electrode on the first gate insulating film, the second gate insulating film, and the third gate insulating film, respectively;

forming a first mask pattern after forming the first gate electrode, the second gate electrode, and the third gate electrode, the first mask pattern covering the second region while exposing the first region and the third region;

forming a first source drain extension in the semiconductor substrate beside the first gate electrode and forming a first pocket region in the semiconductor substrate beside the third gate electrode by implanting ions of a first impurity of a first conductivity type into the semiconductor substrate with the first mask pattern being used as a mask;

forming a second source drain extension in the semiconductor substrate beside the third gate electrode by implanting ions of a second impurity of a second conductivity type into the semiconductor substrate with the first mask pattern being used as a mask, under a condition that makes the second impurity under the first gate insulating film have a lower concentration than the first impurity;

forming a second mask pattern after removing the first mask pattern, the second mask pattern covering the first region and the third region while exposing the second region;

forming a second pocket region in the semiconductor substrate beside the second gate electrode by implanting ions of a third impurity of the first conductivity type into the semiconductor substrate with the second mask pattern being used as a mask, the third impurity having a smaller diffusion coefficient than the first impurity;

forming a third source drain extension in the semiconductor substrate beside the second gate electrode by implanting ions of a fourth impurity of the second conductivity type into the semiconductor substrate with the second mask pattern being used as a mask;

forming a first source drain region of the first conductivity type in the semiconductor substrate beside the first gate electrode;

forming a second source drain region of the second conductivity type in the semiconductor substrate beside the second gate electrode; and forming a third source drain region of the second conductivity type in the semiconductor substrate beside the third gate electrode.

2. The method of manufacturing a semiconductor device according to the claim 1, further comprising:
forming a thermal oxidation film on the first region, the second region, and the third region in the semiconductor substrate before forming the first gate insulating film, the second gate insulating film, and the third gate insulating film;
forming a third mask pattern on the thermal oxidation film, the third mask pattern covering the first region while exposing the second region and the third region; and
forming a first channel region in the second region and forming a second channel region in the third region by implanting ions of a fifth impurity of the first conductivity type in the second region and the third region of the semiconductor substrate with the third mask pattern being used as a mask.

3. The method of manufacturing a semiconductor device according to claim 1, wherein the forming of the second source drain extension further includes:
implanting ions of a sixth impurity of the second conductivity type into a portion of the semiconductor substrate at a depth shallower than an implantation depth of the second impurity with the first mask pattern being used as a mask.

4. The method of manufacturing a semiconductor device according to claim 3, wherein a diffusion coefficient of the sixth impurity is smaller than a diffusion coefficient of the second impurity.

5. The method of manufacturing a semiconductor device according to claim 4, wherein
the second impurity is phosphorus, and
the sixth impurity is arsenic.

6. The method of manufacturing a semiconductor device according to claim 1, wherein the third impurity is indium.

7. The method of manufacturing a semiconductor device according to claim 1, wherein the forming of the first source drain extension and the first pocket region is performed by implanting the first impurity into the semiconductor substrate in a direction oblique to a normal direction of the semiconductor substrate.

8. The method of manufacturing a semiconductor device according to claim 1, wherein the forming of the second source drain extension is performed under a state where the first gate insulating film is formed in the first region.

9. The method of manufacturing a semiconductor device according to claim 1, wherein the forming of the second source drain extensions is performed by implanting ions of the second impurity into a portion of the semiconductor substrate at a depth shallower than the first pocket region.

10. The method of manufacturing a semiconductor device according to claim 1, further comprising:
forming a fourth gate insulating film thinner than the first gate insulating film in a fourth region of the semiconductor substrate;
forming a fourth gate electrode on the fourth gate insulating film;
forming a third mask pattern covering the first region, the second region, and the third region, while exposing the fourth region;
forming a fourth source drain extension in the semiconductor substrate beside the fourth gate electrode by implanting ions of a seventh impurity of the first conductivity type into the semiconductor substrate with the third mask pattern being used as a mask, the seventh impurity having a larger diffusion coefficient than the third impurity; and
forming a fourth source drain region of the first conductivity type in the semiconductor substrate beside the fourth gate electrode.

11. The method of manufacturing a semiconductor device according to claim 10, wherein the seventh impurity is boron.

12. The method of manufacturing a semiconductor device according to claim 1, wherein the forming of the second source drain region and the forming of the third source drain region are performed as a single step.

13. The method of manufacturing a semiconductor device according to claim 1, wherein the first conductivity type is a p type and the second conductivity type is an n type.

14. The method of manufacturing a semiconductor device according to claim 1, wherein a gate length of the first gate electrode is longer than a gate length of the second gate electrode and the third gate electrode.

* * * * *